(12) United States Patent
Hashim et al.

(10) Patent No.: US 8,900,418 B2
(45) Date of Patent: *Dec. 2, 2014

(54) YTTRIUM AND TITANIUM HIGH-K DIELECTRIC FILMS

(71) Applicant: Intermolecular, Inc., San Jose, CA (US)

(72) Inventors: Imran Hashim, Saratoga, CA (US);
Hanhong Chen, Milpitas, CA (US);
Tony Chiang, Campbell, CA (US);
Indranil De, Fremont, CA (US); Nobi Fuchigami, Sunnyvale, CA (US);
Edward Haywood, San Jose, CA (US);
Pragati Kumar, Santa Clara, CA (US);
Sandra Malhotra, Fort Collins, CO (US); Sunil Shanker, Santa Clara, CA (US)

(73) Assignees: Intermolecular, Inc., San Jose, CA (US); Elpida Memory, Inc., Tokyo (JP)

( * ) Notice: Subject to any disclaimer, the term of this patent is extended or adjusted under 35 U.S.C. 154(b) by 184 days.

This patent is subject to a terminal disclaimer.

(21) Appl. No.: 13/677,126

(22) Filed: Nov. 14, 2012

(65) Prior Publication Data

US 2013/0071990 A1    Mar. 21, 2013

Related U.S. Application Data

(63) Continuation of application No. 12/921,776, filed as application No. PCT/US2009/040902 on Apr. 17, 2009.

(60) Provisional application No. 61/047,368, filed on Apr. 23, 2008.

(51) Int. Cl.
*C23C 14/34* (2006.01)
*B05D 5/12* (2006.01)
*H01L 49/02* (2006.01)
*C23C 16/40* (2006.01)
*C23C 16/455* (2006.01)
*H01L 21/314* (2006.01)
*H01L 21/316* (2006.01)
*H01L 27/108* (2006.01)
*H01L 21/02* (2006.01)

(52) U.S. Cl.
CPC .............. *H01L 28/65* (2013.01); *C23C 16/405* (2013.01); *C23C 16/45529* (2013.01); *C23C 16/45531* (2013.01); *H01L 21/3141* (2013.01); *H01L 21/31604* (2013.01); *H01L 27/10852* (2013.01); *H01L 28/40* (2013.01); *H01L 21/02697* (2013.01)
USPC ....................... 204/192.1; 204/192.22; 427/80

(58) Field of Classification Search
CPC ................................ C23C 14/34; B05D 5/12
USPC ............................ 427/80; 204/192.1, 192.22
See application file for complete search history.

(56) References Cited

U.S. PATENT DOCUMENTS 7,227,728 B2 *  6/2007  Lin ............................ 360/324.1
7,238,628 B2 *  7/2007  Demaray et al. ............. 438/785

FOREIGN PATENT DOCUMENTS

KR       1020060038975        * 11/2007

*Primary Examiner* — Bret Chen

(57) ABSTRACT

This disclosure provides (a) methods of making an oxide layer (e.g., a dielectric layer) based on yttrium and titanium, to have a high dielectric constant and low leakage characteristic and (b) related devices and structures. An oxide layer having both yttrium and titanium may be fabricated either as an amorphous oxide or as an alternating series of monolayers. In several embodiments, the oxide is characterized by a yttrium contribution to total metal that is specifically controlled. The oxide layer can be produced as the result of a reactive process, if desired, via either a PVD process or, alternatively, via an atomic layer deposition process that employs specific precursor materials to allow for a common process temperature window for both titanium and yttrium reactions.

15 Claims, 9 Drawing Sheets

US 8,900,418 B2

YTTRIUM AND TITANIUM HIGH-K DIELECTRIC FILMS

CROSS-REFERENCE TO RELATED APPLICATIONS

This application is a Continuation Application and claims priority to U.S. patent application Ser. No. 12/921,776, filed on Sep. 9, 2010, which claims priority to PCT Application No. PCT/US2009/040902, filed on Apr. 17, 2009, which claims priority to U.S. Provisional Patent Application No. 61/047,368, filed on Apr. 23, 2008, each of which is herein incorporated by reference for all purposes.

This document relates to the subject matter of a joint research agreement between Intermolecular, Inc. and Elpida Memory, Inc.

BACKGROUND

Industry continues to search for new semiconductor materials that exhibit a high dielectric constant and low leakage, to enable further miniaturization of electronic technologies. Such materials for example may be used as the dielectric layer in electronic components such as capacitors, memory cell structures, and other types of electronic components. Unfortunately, most materials investigated to date exhibit either high dielectric constant and high leakage, or low dielectric constant and low leakage and so, industry has turned to investigating combinations of these materials in order to develop aggregate materials with the requisite properties.

A need exists for ways to effectively make dielectric layers with high dielectric constant and low leakage. The present invention addresses these needs, and provides further, related advantages.

BRIEF DESCRIPTION OF THE DRAWINGS

FIG. 3 illustrates that the dielectric layer can be formed of a number of discrete monolayers (307, 309, 311, 313 and 315), each deposited by an atomic layer deposition process (ALD) and each having an oxide of both yttrium and titanium. This depiction is one such possibility; as will be further described below in connection with a discussion of specific ALD and PVD processes and, with reference to FIGS. 8-18, these monolayers may also be formed as alternating layers of titanium dioxide ($TiO_2$) and yttrium oxide ($Y_2O_3$).

FIG. 4 shows how the dielectric constant "k" varies for each of two different dielectric layers as a function of yttrium proportion to total metal; a first curve 403 shows variation of dielectric constant for a layer sputtered from separate $TiO_2$ and $Y_2O_3$ targets, and a second curve 405 shows variation of dielectric constant for an amorphous oxide layer having intermixed titanium and yttrium metals (Ti and Y), for example, created as part of a reactive deposition process, or reacted in situ (i.e., following metal mixing), to form an amorphous Ti—Y—Ox dielectric layer. As seen in FIG. 4, the curve 405 associated with the Ti—Y—Ox generally reflects a significantly higher dielectric constant than the curve associated with cosputtered $TiO_2$ and $Y_2O_3$ targets.

As seen in FIG. 5, these curves generally reflect lower leakage with increasing dielectric thickness and increasing yttrium metal fraction [Y/(Y+Ti)].

FIG. 7 shows that vertical peaks (703 and 705) respectively associated with crystal formation of titanium oxide (represented by box 707) and yttrium oxide (represented by box 709) are substantially suppressed when the yttrium contribution to total metal is greater than about sixteen percent (graph 713), but lower than about fifty-one percent (graph 721). These results indicate that an amorphous dielectric film formation may be possible for this Y metal fraction, which is more desirable than separated layers of Y and Ti dielectric crystallite films.

FIG. 12 suggests that of the considered processes, the ALD processes (represented by the third elliptical area 1223) provide especially good results.

FIG. 15 indicates that the yttrium contribution for Y—Ti—Ox films that provide good leakage density and EOT in an ALD process range from about one to five percent, with excellent results obtained for approximately one to two percent yttrium contribution to total metal.

FIG. 20, in particular, illustrates a memory cell 2001 including a cylinder-shaped capacitor 2021.

FIG. 21 illustrates a memory cell 2101 using a pillar- or pedestal-shaped capacitor 2121.

FIG. 22 illustrates a memory cell 2201 using a crown-shaped capacitor 2221.

DETAILED DESCRIPTION

Figure 1:
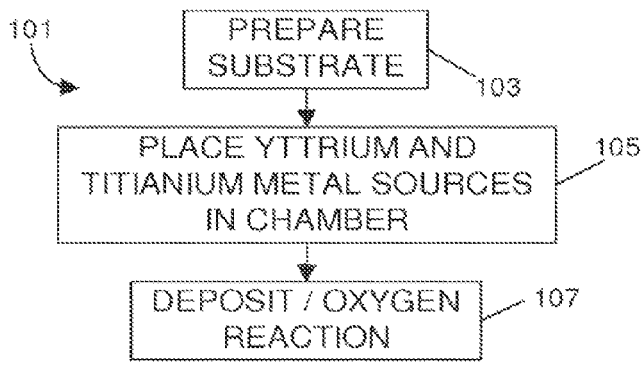
FIG. 1 is a flow chart of one embodiment of a method of forming a dielectric film.

The invention defined by the enumerated claims may be better understood by referring to the following detailed description, which should be read in conjunction with the accompanying drawings. This description of one or more particular embodiments, set out below to enable one to build and use various implementations of the invention or inventions set forth by the claims, is not intended to limit the enumerated claims, but to exemplify their application to certain methods and devices. The description set out below exemplifies (i) a method of forming a dielectric layer, namely, one having an oxide layer that includes yttrium and titanium (either together, or in separate monolayers), and (ii) a device based on such a dielectric, implemented for example as a semiconductor stack, a capacitor, a DRAM cell, or similar structure. The invention, however, may also be applied to other methods and devices as well.

I. INTRODUCTION

As mentioned previously, it is generally desired to be able to fabricate dielectric layers having a high dielectric constant and low leakage, especially for thin dielectric layers. This disclosure provides examples of materials that may be used to fabricate those layers and methods for creating those layers, namely, based on yttrium and titanium.

While relatively good results can be achieved using a combination of titanium oxide (TiO$_2$) and yttrium oxide (Y$_2$O$_3$), more detailed features of the technology presented below demonstrate that additional improvements can be obtained, such as even higher dielectric constant and lower leakage, (a) using a Ti—O—Ox amorphous dielectric layer or (b) using a process such as an atomic layer deposition ("ALD") or a physical vapor deposition ("PVD") process to deposit titanium and yttrium in a manner that produces an amorphous layer. In this regard, titanium oxide (TiO$_2$) by itself generally exhibits relatively high dielectric constant but high leakage, and yttrium oxide (Y$_2$O$_3$) by itself generally exhibits lower dielectric constant and lower leakage. By using both titanium and yttrium as part of a reactive process, a dielectric layer can be formed to have higher dielectric constant and lower leakage than possible using non-reactive combination of crystalline oxides. Alternatively, by suppressing crystallite formation, as facilitated by using specific proportions of yttrium contribution to total metal, a layer can be fabricated having improved dielectric properties.

The disclosure below also introduces structures that can be formed based on the oxides disclosed herein, and presents empirical measurements of electrical properties that can be achieved using such an oxide. A variety of fabrication processes can be used to create such an oxide, in general, including physical vapor deposition ("PVD"); however, one specific process found especially suitable will be presented below, namely, one based on atomic layer deposition ("ALD"). For some materials, the ALD process has been found to be more desirable; due to conformal nature of its deposition, it can provide superior step coverage over a 3-dimensional surface such as those used in a DRAM capacitor device. As will also be described below, if desired, an annealing procedure (e.g., "RTA in an oxidizing environment") can be utilized to achieve a more uniform oxide structure (e.g., by reducing oxygen vacancies and defects remaining following the initial fabrication steps). Finally, applications of the oxides presented herein to capacitor fabrication and to dynamic random access memory ("DRAM") cell fabrication will be presented. It has been found that the use of a reactive PVD fabrication process, that is, one that deposits titanium and/or yttrium in an environment where oxide is formed during the deposition process, or in a manner closely associated with it, gives good results. One difficulty that arises in creating this dielectric layer, however, is that it is difficult to reactively deposit both of yttrium and titanium in a reactive process so that they (or their oxides) effectively intermingle. This difficulty occurs because the common oxygen sources react with common sources of titanium and yttrium, respectively, at substrate temperatures of approximately 150-250 degrees Celsius and 300-350 degrees Celsius. To deposit yttrium and titanium together or in very close succession in an ALD process therefore suggests the need for mechanisms to overcome this difficulty.

Therefore, among the teachings provided herein, this disclosure provides (1) methods for depositing titanium and yttrium in a reactive process at a substantially common temperature, and (2) devices having an oxide layer formed by these methods. The presented common transfer methodologies are especially useful where the fabrication process involves relies upon ALD to form the dielectric material. More particularly, one specific embodiment presented below presents a method of depositing titanium and yttrium using specific chemical reactions, chosen such that the ALD process can effectively occur at a common substrate temperature. For example, by using alkoxide, alkylamide or Cp-based precursors or their derivatives as sources for titanium, and Cp-based or β-diketonoate-based materials as sources for yttrium, a reaction can be made to occur between such materials and an oxygen source to react titanium and yttrium with oxygen within a relatively narrow temperature window. Some specific process embodiments discussed below use ozone ($O_3$) as the oxygen source. In still further refinements of this embodiment, an atomic layer deposition ("ALD") or similar process may be used to create thin oxides of yttrium and titanium in thin layers using a source of oxygen. As an option, the use of ozone ($O_3$) as the oxygen source, as opposed to oxygen gas ($O_2$) or water ($H_2O$), has been found to be beneficial in further improving the dielectric constant of the fabricated materials.

Before proceeding to details of specific processes, general procedures for fabricating an oxide layer and associated deposition processes will first be introduced. As used herein, an oxide "layer" should be understood to refer to either (a) the entire dielectric layer, which may consist of a single layer or one or more "monolayers" that together cooperate to form the dielectric layer, as well as (b) individual monolayers to the extent that each of these includes oxide, e.g., an oxide of titanium, yttrium, or both. The term "monolayer" should be understood to refer to a single layer of a relatively homogeneous composition (i.e., one or more materials), and thus, a "layer" may refer to a single layer, to an aggregate combination of layers, or to one or more monolayer. The term "Ti—O—Ox" should be understood to refer to an oxide mixture that has both yttrium and titanium together in known or unknown quantities, but a relatively homogeneous mixture, e.g., a monolayer that has oxygen sometimes bonding to titanium, sometimes to yttrium. The term "amorphous" should be understood to refer to a mixture with no crystalline structure, e.g., the term may be applied to a Ti—O—Ox layer or to a $TiO_2$ layer, a $Y_2O_3$ layer or to any other layer or material.

FIG. 1 illustrates a method 101 by which an oxide layer may be formed. In particular, a substrate upon which materials are to be deposited is first prepared, as indicated by function block 103. The substrate may be any material capable of supporting a layer of semiconductor material, and may include a metal conductor, insulator, glass or another material. "Preparation" of the layer typically includes cleaning the substrate to promote good adhesion between deposited layers and the substrate, and to otherwise ready the substrate's surface for a semiconductor deposition process.

As mentioned above, for certain embodiments, it may be desired to fabricate one or more amorphous oxide layers (or monolayers) having both yttrium and titanium together. Function block 105 of FIG. 1 therefore calls for the use of sources of titanium and yttrium metals as constituent elements of the deposition process. There are a variety of forms in which these metals may be provided, such as in the form of pure metals (Ti and Y, respectively), compound oxides ($TiO_2$ and $Y_2O_3$) or solvents, organometallics, and other metal carriers but, ideally, the chosen components are capable of transferring one or both metals for use in a reactive process, either at the same time or in close succession.

With metal sources introduced to a vacuum chamber for use in a semiconductor fabrication process, the metals are then transferred to the substrate in combination with a preferably reactive process, as indicated by process block 107. The reactive process may be one that causes oxide formation (or reformation) as (or after) the metals (Ti and Y) are introduced, to create an oxide having a relatively amorphous structure. The term "reactive," as used herein, may be applied to either PVD or ALD processes, and may refer to the formation of a metal oxide layer by using metal targets or precursors that are reacted with oxygen-containing gasses or precursors. For example, in the ALD context, a reactive process may be one that uses a metal precursor as a source of titanium and/or yttrium metal, and an oxidizing precursor (e.g., ozone, water vapor, oxygen) to form a metal oxide.

As will be presented below, with proper process controls, it has been found that a Ti—O—Ox layer may be fabricated to have a dielectric constant equal to or greater than approximately sixty while having leakage characteristics that are significantly better than titanium oxide ($TiO_2$) and that approach the leakage characteristics of crystalline yttrium oxide ($Y_2O_3$). Thus, the method 101 presented by FIG. 1 provides results that are significantly better than achieved by simply sputtering two component oxide targets. The resultant Ti—O—Ox layer may be thought of an amorphous titanium oxide ($TiO_2$) that has been doped with yttrium (e.g., yttrium-doped $TiO_2$).

Figure 2:
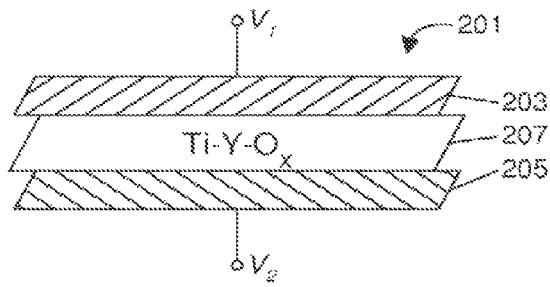
FIG. 2 is a cross-sectional view of a capacitive device having two conductors and a dielectric film or "layer" formed according to principles provided by this disclosure.

As alluded to above, an oxide layer made according to the principles presented in this disclosure may be used to fabricate electronic devices. FIG. 2 illustrates one such device 201, namely, a capacitor. A capacitor is an electronic device with two conductive leads, each of which connects to a conductive plate, and a dielectric material between the plates; the capacitor is operated to store charge (i.e., $V_1 V_2$) between the plates, across the dielectric material. In FIG. 2, these two conductive plates are indicated by reference numerals 203 and 205, and are illustrated as separated by a Ti—O—Ox dielectric layer 207. By manufacturing devices utilizing such a material, given its relatively high dielectric constant and low leakage, electronic devices (such as the capacitor depicted by FIG. 2) may be fabricated on an increasingly small basis, with a lower minimum layer thickness limitation for separating charge plates 203 and 205 (at least not relative to conventional technology), which results in higher capacitance due to thinner dielectric. [For purposes of comparison, aluminum oxide ($Al_2O_3$), a conventional dielectric material used for DRAM capacitor applications) has a dielectric constant of approximately 8, compared to dielectric constant of 40, 60 and potentially even higher for the materials presented by this disclosure, while providing approximately the same leakage density as aluminum oxide; thus, the materials provided by this disclosure present the possibility of facilitating significant additional miniaturization improvements, by increasing the stored charge density for a capacitor based on this material.] A thickness for a dielectric which provides sufficient capacitance but low enough leakage may be approximately 5-20 nm, preferably 812 nm. Notably, as with all FIGS. in this disclosure, the depicted size and thickness of layers, including relative dimensions, should be read as illustrative only.

Figure 3:
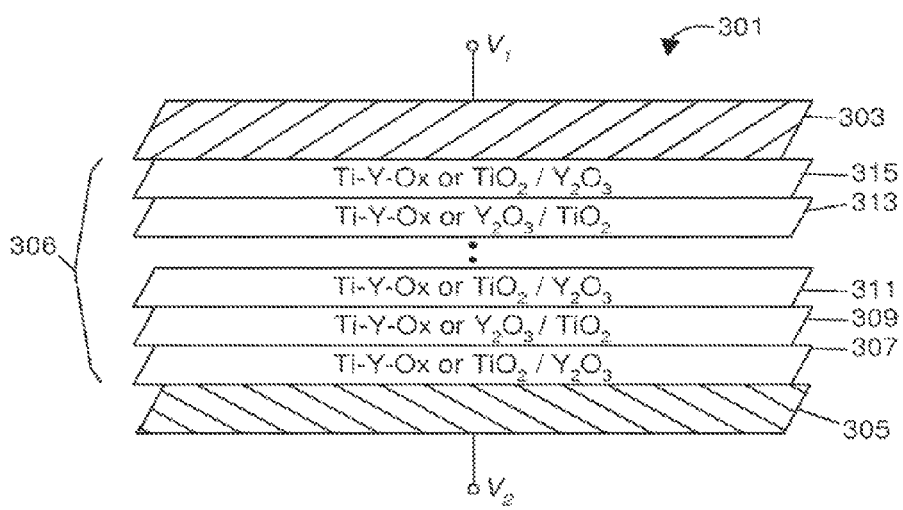
FIG. 3 is another cross-sectional view of a capacitive device having two conductors and a dielectric layer.

FIG. 3 depicts another embodiment of a capacitive device 301, namely, one manufactured using an atomic layer deposition ("ALD") process. As shown in FIG. 3, a capacitor may include two conductive layers 303 and 305 which together sandwich a dielectric region 306. To store charge on the device, a voltage potential is applied to each conductive layer 303 and 305 via a set of nodes, i.e., as indicated by the two depicted voltages, $V_1$ and $V_2$. The dielectric region, in turn, is seen to include a large number of individual layers 307, 309, 311, 313 and 315; each layer may be an amorphous Ti—O—Ox monolayer or a discrete titanium dioxide ($TiO_2$) or yttrium oxide ($Y_2O_3$) monolayer. While only five layers are depicted in FIG. 3, it should be noted that the number of layers is arbitrary and depends upon desired thickness of a fabricated device; for example, one embodiment of such a device features a total thickness in range of 5-10 nm to achieve an appropriate level of capacitance while minimizing leakage. In this regard, an ALD process typically deposits a single, conformal layer at a time, each with "atomic scale" thickness, for use in various semiconductor processing operations; that is to say, each layer is thin and is formed according to a self-limiting, reactive process that deposits a single atomic scale layer for a surface-based chemical reaction of two or more reagents, with the reaction stopping as soon as the atomic scale layer is completed. By creating individual, reacted, atomic scale layers in this manner, each as part of an ALD "cycle," a dielectric region may be built up to theoretically any desired thickness. A typical thickness per ALD cycle may be on the order of one-half Angstrom so that, for example, forty cycles might be used to create a dielectric region having a two nanometer thickness.

With the presentation of a way to make a suitable dielectric layer based on both titanium and yttrium thus introduced, additional detail regarding obtainable electrical characteristics and associated process considerations will now be presented.

II. ELECTRICAL CHARACTERISTICS AND PROCESS CONSIDERATIONS

FIGS. 4-7 are used to describe electrical characteristics of different oxide layers fabricated with titanium and yttrium formed using a PVD process, and to present associated process considerations. FIGS. 4-7 will focus on showing improved dielectric characteristics and leakage of a Ti—O—Ox layer. It is believed that some of these characteristics (at least relative to sputtered crystallites) may also be shared by discrete $TiO_2$ and $Y_2O_3$ layers if deposited in a reactive manner, so as to be relatively amorphous following deposition.

Figure 4:
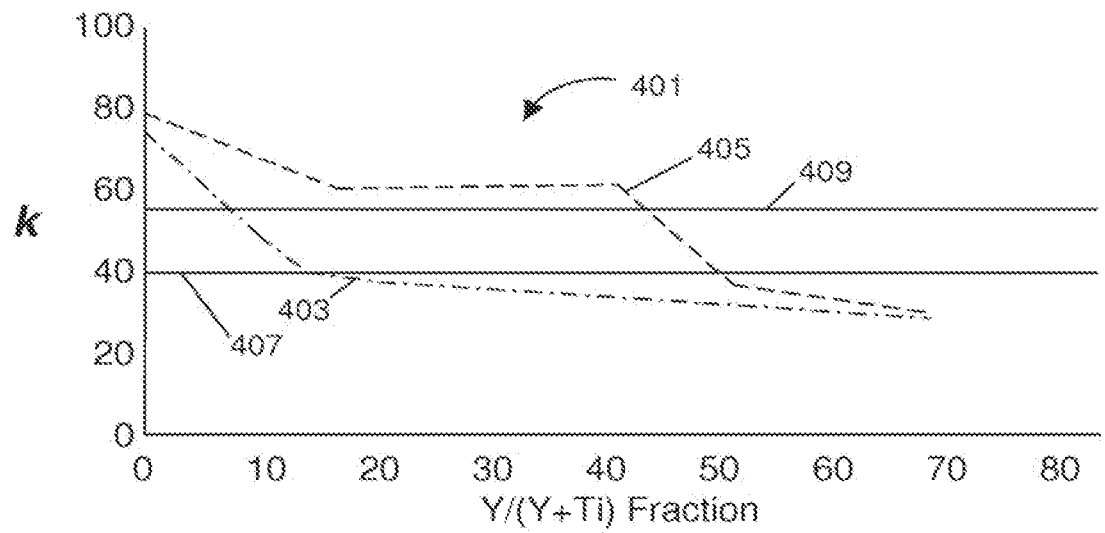
FIG. 4 is a graph illustrating advantages of a dielectric layer formed to have titanium and yttrium within each oxide layer such as can be formed, for example, via a reactive process that minimizes formation of separate, crystalline layers of $TiO_2$ and $Y_2O_3$. In particular.

FIG. 4, in particular, illustrates a chart 401 that plots dielectric constant as a function of yttrium doping or amount of yttrium metal as a function of total metals, i.e., as represented by the legend "Y/(Y+Ti)." Two different curves 403 and 405 are depicted in FIG. 4: (a) a first curve 405 represents dielectric constant obtained for different proportions of yttrium, using one or more amorphous Ti—O—Ox layers (e.g., created using a reactive sputter process that uses sources of titanium and yttrium metals sputtered in an oxygen-rich environment or an ALD process); and (b) a second curve 403 represents dielectric constant obtained for an oxide film which is prepared by sputtering from separate titanium oxide ($TiO_2$) and yttrium oxide ($Y_2O_3$) sputter targets (i.e., non-reactively deposited). As seen in FIG. 4, for dielectric composition which is purely titanium oxide, both processes produce a dielectric constant of nearly eighty, which matches the excellent dielectric constant associated with pure rutile (crystalline 100% $TiO_2$); unfortunately, this material on its own has unacceptable leakage characteristics, especially for thicknesses below 20 nm. As the yttrium content is increased, the dielectric constants associated with these two curves diverge; as depicted by the first curve 405, the reactive process (when metal yttrium and metal titanium are reacted during or in association with transfer) results in a dielectric constant that slowly drops as yttrium doping/contribution is increased, but that levels off and remains relatively constant through a range of approximately sixteen to forty-one percent yttrium contribution to total metal. The dielectric constant is seen to remain above approximately 55 throughout this range, providing excellent results. By contrast, the process based on a non-reactive combination of oxides (represented by curve 403) yields a dielectric constant that quickly drops below forty (for yttrium contribution to total metal greater than about ten percent). FIG. 4 shows two horizontal lines for reference purposes, including a first line 407 that signifies a dielectric constant of forty, and a second line 409 that signifies a dielectric constant of fifty-five. As seen in FIG. 4, the reactive process results in a far superior dielectric constant over a greater range of yttrium than obtained by non-reactive sputtering from separate $TiO_2$ and $Y_2O_3$ targets. In fact, for a yttrium to total metal ratio of forty percent, FIG. 4 indicates that the dielectric constant for a layer prepared according the methods presented herein still produces a dielectric constant on the order of sixty.

Thus, at least two ranges are supported by FIG. 4: (a) a first range, representing a dielectric constant of forty or greater (yttrium contribution to total metal of up to approximately fifty-one percent); and (b) a second range, representing a dielectric constant of fifty-five or greater (yttrium contribution to total metal of up to approximately 40-41%). As well be seen below in connection with the discussion of how yttrium contribution affects leakage, the ranges that optimize both leakage and dielectric constant may be further refined to (a) approximately 8-10 to about 51% yttrium contribution to total metal, and (b) approximately 16-20 to about 40-41% yttrium to total metal.

FIG. 4 also generally indicates that a reactive process produces better results; it is in turn believed that the reason for such improved results is that a reactive process using protocols discussed below produces a relatively more amorphous deposition. That is to say, it is believed that the divergence of dielectric properties between the amorphous Ti—O—Ox layer, on the one hand, and the film sputtered from $TiO_2$ and $Y_2O_3$ targets, on the other, is due either to different bonding structure within the dielectrics or, alternatively, is the byproduct of more crystalline structure of the latter oxides, or defects associate with sputtering crystalline oxides.

Notably, within the ranges discussed (e.g., 10 to 51 percent yttrium contribution to total metal as discussed above), it may be desired to maximize yttrium proportion within this range; yttrium is generally thought to provide favorable leakage characteristics and, thus, the greater the proportion of yttrium present, the more favorable the leakage characteristics of the resultant dielectric layer. Thus, as reflected by relatively consistent dielectric properties for yttrium contribution of between about twenty to forty percent of total metal, particularly good results should be obtainable for a yttrium contribution of about forty percent total metal. A skilled designer may, however, vary yttrium as a constituent as needed to maximum dielectric constant in view of other process demands.

Figure 5:
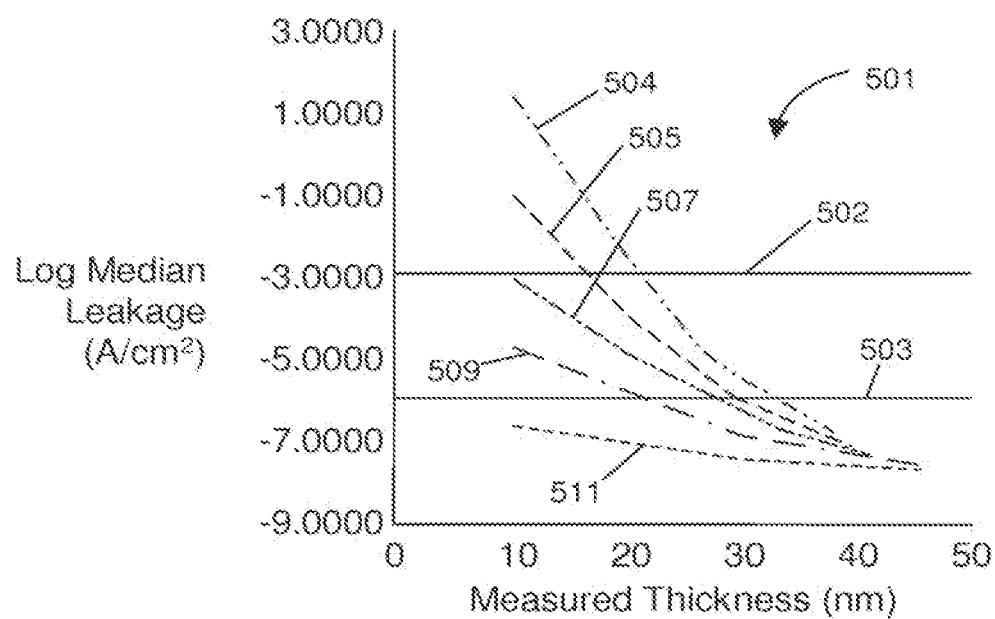
FIG. 5 is a graph illustrating advantages of a dielectric layer formed with both titanium and yttrium within each oxide layer such as, for example, via a reactive process that minimizes formation of titanium oxide and yttrium oxide crystallites. In particular, FIG. 5 plots variation of leakage density versus dielectric layer thickness, each as a function of different yttrium proportion to total metal [Y/(Y+Ti)]. The group of curves 504, 505, 507, 509 and 511 each show variation in leakage density for Ti—Y—Ox layers for different yttrium metal fractions [Y/(Y+Ti)].

FIG. 5 is a graph 501 that plots leakage as a function of dielectric layer thickness, measured in nanometers ("nm"). In particular, FIG. 5 illustrates two horizontal reference lines 502 and 503, representing different, arbitrary leakage thresholds, and five curves, 504, 505, 507, 509 and 511, which indicate how leakage varies with layer thickness. The vertical axis in FIG. 5 represents the logarithm of median leakage density in units of amps ("A") per square centimeter ("$cm^2$").

The five curves each respectively represent different levels of yttrium doping/contribution to metal, including zero percent yttrium (curve 504), sixteen percent yttrium (curve 505), forty-one percent yttrium (curve 507), fifty-one percent yttrium (curve 509) and sixty-six percent yttrium (curve 511). The first curve 504 illustrates that, for pure rutile $TiO_2$, leakage is the most noticeable, especially for thin layers; by contrast, as yttrium contribution is increased (as noticed by the progression from curve 504 to curve 511), the leakage is seen both to decrease and to also approach a constant, relatively small value. That is to say, as the proportion of yttrium is increased, the resultant leakage both decreases and ultimately behaves in a manner almost independent of layer thickness, both desirable properties. The data presented in FIG. 5 indicates that, as mentioned above, increasing yttrium also increases favorable leakage characteristics (i.e., lower leakage for thin dielectric layers).

As mentioned, the two horizontal lines 502 and 503 represent different, arbitrary thresholds, used for comparison purposes. The upper horizontal reference line 502 indicates that for yttrium levels of about 40% (curve 507), or more, leakage is dramatically reduced, remaining below the upper horizontal reference line 502 even for very thin dielectric layers. The lower horizontal reference line 503 indicates that, for yttrium levels on the order of fifty-one percent of total metal (represented by curves 509 and 511), leakage starts to become de minimus, remaining below the lower threshold 503 for substantially the entire range of indicated layer thicknesses.

As alluded to earlier, it is desirable to maintain a high dielectric constant while maintaining as little leakage as possible (for thin dielectric layers). While rutile (crystalline $TiO_2$) has an excellent dielectric constant (near eighty), FIG. 5 shows that leakage becomes unacceptable for thin crystalline $TiO_2$ layers, especially for thicknesses below 20 nm.

Figure 6:
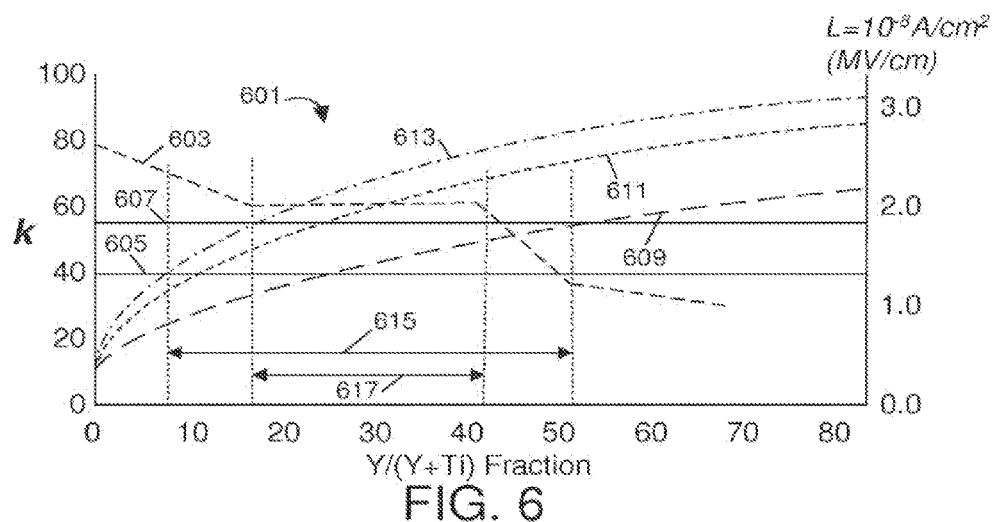
FIG. 6 is a composite graph, illustrating how yttrium contribution to total metal may be varied to simultaneously affect both dielectric constant and leakage for a Ti—Y—Ox layer. The left vertical axis of FIG. 6 represents dielectric constant, while the right vertical axis represents electric field retention, expressed in millions of volts stored per centimeter of dielectric thickness (i.e., capacitor dielectric thickness) that results in a leakage of 10-8 amps per square centimeter of capacitor area. Generally speaking, in some embodiments, it may be desired to simultaneously maximize a first curve 603 (representing dielectric constant as a function of yttrium contribution to total metal) as well as a second set of curves 609, 611 and 613 (representing inverse of leakage density as a function of different yttrium metal fractions).

FIG. 6 is used to illustrate relative benefits of Ti—O—Ox layers made with different proportions of yttrium. In particular FIG. 6 presents a visual overlay 601 of competing curves that, taken together, illustrate the relationship between dielectric constant and leakage as a function of yttrium contribution. A first vertical axis (seen at the left-hand side of FIG. 6) represents the dielectric constant "k," while a second vertical axis (seen at the right-hand side of FIG. 6) represents favorable leakage characteristics (i.e., the inverse of leakage, expressed in terms of electric field in millions of volts per centimeter of dielectric thickness needed to create a leakage density of 10-8 amps per square centimeter). Curve 603 is linked to the left-hand vertical axis, while curves 609, 611 and 613 are linked to the right-hand vertical axis.

The first curve 603 shows variation of dielectric constant for the Ti—O—Ox layer, introduced above, as a function of yttrium contribution to total metal. Superimposed over this curve, three other curves, 609, 611 and 613 show how leakage varies as the yttrium contribution is altered. The differences between these latter three curves represent the annealing process used to complete fabrication of a dielectric layer; a first curve 609 represents leakage for an anneal temperature of seven hundred degrees Celsius (in an oxygen ambient), a second curve 611 represents leakage for an anneal temperature of six hundred degrees Celsius (in an oxygen ambient), and a third curve 613 represents leakage for an anneal temperature of five hundred degree Celsius (in an oxygen ambient). Also seen in FIG. 6 are the two horizontal reference lines 605 and 607, used to respectively delineate dielectric constants of forty and fifty-five (which also correspond with increasingly desirable leakage characteristics), for purposes of discussing the reconciliation of low leakage (represented by a higher value on the righthand axis) with high dielectric constant (represented by a higher value on the left-hand axis).

Taken together, the various curves 603, 609, 611 and 613 indicate that dielectric constant and favorable leakage characteristics may be simultaneously optimized for an amorphous Ti—O—Ox layer or monolayer assembly by choosing an appropriate percentage of yttrium as a function of total metals and an optimum dielectric thickness. For a yttrium metal fraction of about ten percent, dielectric constant is seen to still remain above approximately sixty, that is, above the horizontal reference line 607 (dielectric constant roughly equal to fifty-five), while leakage is good, but remains relatively high relative to other values for yttrium contribution (an electric field of about 10 MV/cm is needed to produce a reference leakage). By contrast, as yttrium contribution is increased above twenty percent, the leakage drops by as much as half (an electric field of greater than 20 MV/cm is needed to produce the reference leakage). Beginning with a yttrium contribution of just over forty percent relative to total metal, the dielectric constant starts to falloff sharply, and drops to below forty as yttrium content exceeds roughly fifty-one percent of total metal.

What the data presented in FIG. 6 suggests is that having yttrium constitute between ten and fifty-one percent of total metal deposited in a reactive process produces very good results, with optimal results for a yttrium proportion of roughly twenty-to-forty percent of total metal (e.g. a sixty or greater dielectric constant being achieved with acceptable leakage), for dielectric thickness of ~10-20 nm. These ranges are respectively indicated by range lines in FIG. 6 and associated reference numerals 615 and 617. As indicated by comparing curves 609, 611, and 613, an anneal process of five hundred to six hundred degrees in an oxygen-rich environment appears to be optimal among the processes referenced in FIG. 6.

Figure 7:
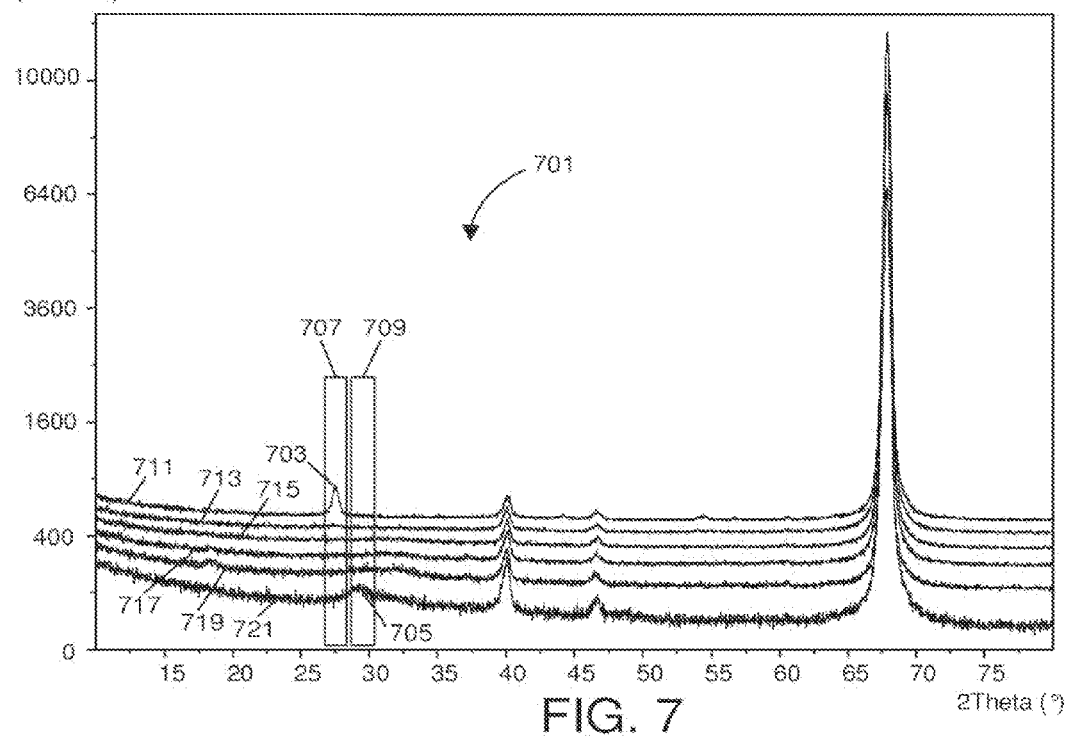
FIG. 7 is a graph 701 showing XRAY diffraction of five different oxides, each having a different yttrium proportion to total metal.

As mentioned earlier, it is believed that for certain conditions, co-sputtering titanium and yttrium from pure metal sputter targets and forming the oxide in a reactive process helps minimize crystalline formation, leading to better dielectric properties. FIG. 7 presents an XRAY diffraction ("XRD") spectrum, graph 701 for different dielectric layers. In particular, FIG. 7 has a horizontal axis representing twice the X-ray beam angle with respect to the sample with peaks 703 and 705 corresponding to crystalline $TiO_2$ (rutile) and crystalline yttrium oxide ($Y_2O_3$), respectively. Two vertical boxes 707 and 709 are used to show the location where crystalline peaks for these materials/phases may be observed in the various XRD spectra. [Notably, FIG. 7 also shows several other peaks, at angles of approximately forty-one and sixty-eight degrees respectively, corresponding to the use of platinum as an electrode.] FIG. 7 shows six curves, which respectively represent the following yttrium proportions: (a)

zero percent, i.e., rutile $TiO_2$ (curve 711), (b) sixteen percent yttrium (curve 713), (c) forty-one percent yttrium (curve 715), (d) forty-four percent yttrium (curve 717), (e) fifty-one percent yttrium (curve 719), and (f) sixty-six percent yttrium (curve 721). What the data of FIG. 7 indicates is that crystalline $TiO_2$ begins to disappear as yttrium fraction is increased, and is completely absent for yttrium combinations having at least sixteen percent yttrium, but that crystalline yttrium oxide ($Y_2O_3$) begins to appear as yttrium increases over fifty-one percent, with a $Y_2O_3$ peak 705 present in the final curve 721. Under the assumption that an amorphous Ti—O—Ox dielectric layer (that is, one having substantially no crystalline peaks) is desired for its leakage properties, the data presented in FIG. 7 suggests that yttrium should constitute between about sixteen and fifty-one percent total metal in order to minimize leakage.

With the electrical characteristics of several material layers in mind, further detail for specific, exemplary fabrication processes will now be presented. As mentioned above, while Ti—O—Ox is seen to produce very good results, particularly for layers produced in a reactive sputter or ALD process, it is believed that good results may also be obtained for reactive processes that can produce amorphous $TiO_2$ and $Y_2O_3$ monolayers, e.g., through specific ALD processes as described below.

III. EXEMPLARY FABRICATION PROCESSES

As indicated above, a variety of fabrication processes may be used to create an oxide layer according to the teachings of this disclosure. Two specific processes will be discussed below, namely, one that uses atomic layer deposition ("ALD") principles, and one that uses a co-sputtering physical vapor deposition ("PVD") process. Many other processes may also be used to create structures described in this disclosure, including without limitation, CVD and evaporative processes.

A. Atomic Layer Deposition.

FIGS. 8-15 are used to present ALD processes that may be used to make a structure having a dielectric layer (or one or more monolayers), such as for example, the device depicted in FIG. 3.

As indicated above, atomic layer deposition or "ALD" refers to a process used to deposit conformal layers with atomic scale thickness during semiconductor processing operations. ALD may be used to deposit barrier layers, adhesion layers, seed layers, dielectric layers, conductive layers, etc. ALD is generally regarded a multistep, self-limiting process that includes the use of at least one precursor and at least one reagent. Generally, a precursor is introduced into a processing chamber and adhered to a substrate, often using a reagent for adherence. [This initial adherence of a reagent in an ALD process is sometimes referred to as "pretreatment."] The precursor can be, for example, a gas that is injected into a reaction chamber. Excess precursor is then purged or pumped away, as appropriate. A reagent (e.g., the first reagent or a second reagent) is then introduced into the chamber, either to further react with the adhered layer, or to serve as a reagent for a second layer, as part of a second "cycle."

The ALD reaction is regarded as self-limiting in that the reaction terminates once the initially adhered layer is consumed by the one or more reagents. Formation of a complete assembly using the aforementioned steps constitutes one deposition (or ALD cycle), and the process can then be repeated as necessary to form additional monolayers, with the number of cycles (and number of atomic layers) determining the film's total thickness.

In connection with formation of a metal oxide, an ALD cycle can include the introduction of a source of metal as a precursor. More particularly, in a process used to transfer yttrium or titanium oxide onto a substrate surface, a source of oxygen can be used as a first reagent and adhered to the substrate. Generally speaking, suitable sources of oxygen, depending on implementation, may include oxygen gas, ozone gas, water (e.g., water vapor) or potentially other oxidizers. Following evacuation of excess oxygen material from the ALD chamber, a source of metal can then be introduced as the precursor in a gaseous form, that is, in a form that reacts with the oxygen source. Using a Ti precursor such as titanium tetra-isopropoxide (TTIP), or specific other materials, the resultant reaction yields titanium oxide adhered to the substrate surface and byproducts such as methane, water and potentially other materials, which are pumped away. Some suitable precursor materials, depending on process and application, may include (a) in the case of Ti precursors, materials such as $TiF_4$, $TiCl_4$, $TiBr_4$, $TiI_4$, $Ti[N(C_2H_5CH_3)]_4$ (TEMAT), $Ti[N(CH_3)_2]_4$ (TDMAT), or $Ti[N(C_2H_9)]_4$ (TDEAT), and (b) in the case of Y precursors, materials such as $Y(N(SiMe_3)_2)_3$, $Y(N(iPr)_2)_3$, $Y(N(tBu)SiMe_3)_{3f}$, $Y(TMPD)_3$, $Cp_3Y$, $(MeCp)_3Y$, $((nPr)Cp)_3Y$, $((nBu)Cp)_3Y$, $Y(OCMe_2NMe_2)S$, $Y(THD)_3$, $Y[OOCCH(C_2H_5)C_4H9]_3$, $Y(C_{ii}H_{19}\ominus_2)_3$ $CH_3(OCH_2CH_2)-_3\ominus CH_3$, $Y(CF_3COCHCOCF_3)S$, $Y(OOCC_{10}H_y)_3$, $Y(OOC_{io}H_{19})_s$, $Y(O(iPr))_3$ and the like. Irrespective of precursor choice, after application, excess precursor material can be purged or pumped away as appropriate. In some embodiments, a Ti precursor may be an alkoxy-based precursor (e.g., TTIP) or an alkylamide-based precursor (e.g., TEMAT or TDMAT). In some embodiments, a Y precursor may be a diketonate-based precursor or a cyclopentadienyl (Cp)-based precursor (e.g., Y(MeCph). An oxygen source (e.g., water vapor, oxygen gas, ozone, plasma) can then be introduced to react with any remaining metal atoms that have not oxidized and, subsequently, purged or pumped away as appropriate. To create an oxide layer that includes both yttrium and titanium together (Ti—O—Ox), sources of yttrium and titanium can be introduced separately (e.g., without an intervening purge) or as a mixed gas.

Figure 8:
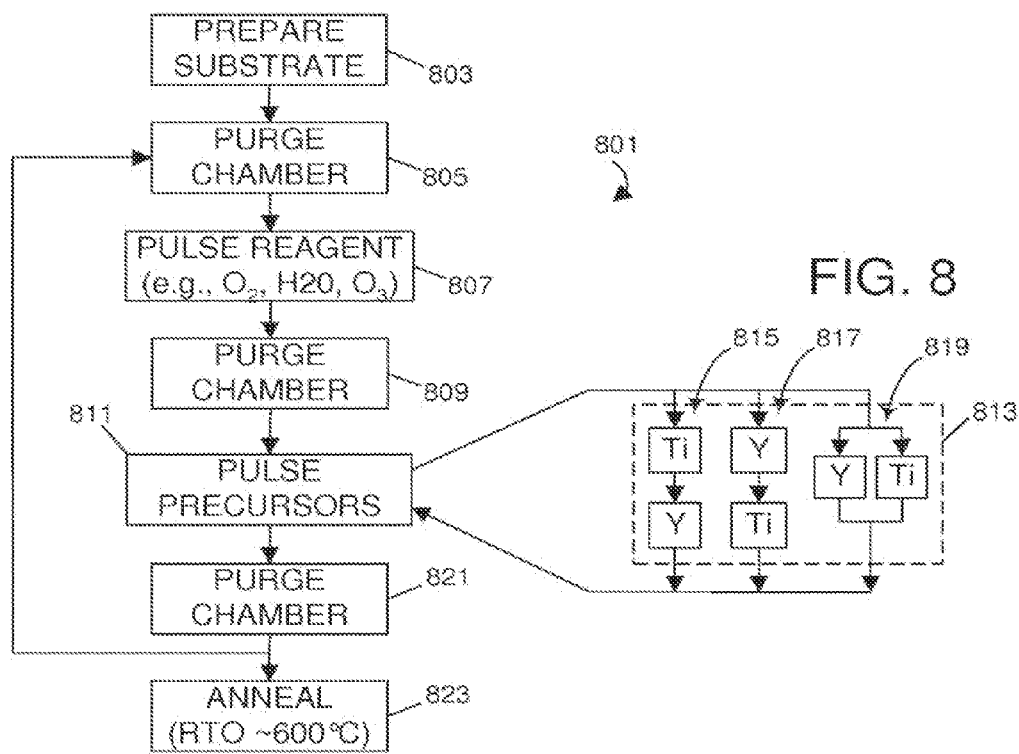
FIG. 8 is a block diagram, similar to FIG. 1, of an embodiment that illustrates use of an ALD process to create an oxide layer; as indicated earlier, this oxide layer may include a number of monolayers. In some embodiments, these monolayers may be configured as individual oxide layers each having both yttrium and titanium; in other embodiments, these monolayers may be configured as each including yttrium or titanium (e.g., as individual, alternating layers of $TiO_2$ and $Y_2O_3$).

FIG. 8 illustrates this method, generally denoted by reference numeral 801. As indicated by block 803, a substrate is first prepared and introduced into a clean room environment. The preparation steps may be any steps suitable to the substrate and other materials at issue, for example, as may be necessary to deposit a first electrode on a substrate (e.g., a wet or dry cleaning process). The substrate may be any material suitable for use in supporting a semiconductor layer, including metal, glass, some other insulator, or another material, conventional or otherwise. If a dielectric layer is to be formed in the same chamber, directly after electrode formation, then it may not be necessary to apply further preparation or cleaning steps. To fabricate the dielectric layer, air is then purged from the chamber by a vacuum process, as indicated by function block 805, and a reagent (such as oxygen gas, ozone gas, water vapor, or some other oxygen source) is introduced to the chamber in block 807 to adsorb to and pretreat the surface of the substrate. The chamber is then again purged, to leave only a monolayer of the reagent on the top surface of the substrate, as indicated by block 809. One or more precursors are then introduced to the chamber to react with the reagent (e.g., for an exposure time of from one to ten seconds), as indicated by block 811. In fact, as seen in the exploded detail at the right side of FIG. 8, three options exist for applying the precursor, as contained within a dashed-line block 813. First, a titanium precursor can be applied as a pulse of gas, followed by a pulse of a yttrium precursor, as collectively indicated by arrow 815.

These pulses may be applied if desired without any intervening purge or intervening introduction of an oxygen source (e.g., if it is desired to form monolayers having an oxide with both metals present together). Second, as depicted by a second arrow 817, a yttrium precursor may be introduced first, followed by a titanium precursor. As with the first option, these pulses may be applied without an intervening purge or oxygen source introduction, or with only one of them as an intervening step. Finally, as indicated by an arrow 819, both precursors may be together injected into the chamber via a simultaneous pulse of their respective gasses. The gas or gasses used as a source for each metal may be one or more organometallics, each for example, a methyl group based on the respective metal; that is to say, the resulting reaction produces an layer of a metallic oxide being left atop the substrate and a byproduct, such as gaseous methane. As indicated previously, the reaction proceeds to consume the top layer of the deposited reagent, and then stops, with the remaining gasses being evacuated (as indicated by process block 821). The cycle's result is an atomic layer having a thickness on the order of a fraction of an Angstrom to several Angstroms. This cycle may be then repeated as necessary to deposit any number of desired layers (e.g., forty times to produce a two-nanometer thick dielectric layer for a hypothetical growth rate of 0.5 Å/ALD cycle). When the dielectric layer of the appropriate thickness and metal electrode have been formed, the assembly is subjected to an anneal process in an oxygen-rich environment, identified by reference numeral 823, which further oxidizes the fabricated film to fill remaining oxygen vacancies and reduce defects in the film, to promote an amorphous layer. Although shown in FIG. 8 in connection with an ALD process, the anneal process is optional (depending on process), and if an anneal is used, it can be performed at any stage of device formation, including after other layers (including an electrode) have been deposited atop a completed dielectric layer or layers. While a RTO process is indicated in FIG. 8, a variety of anneal processes may also be used, depending on design objectives.

Figure 9:
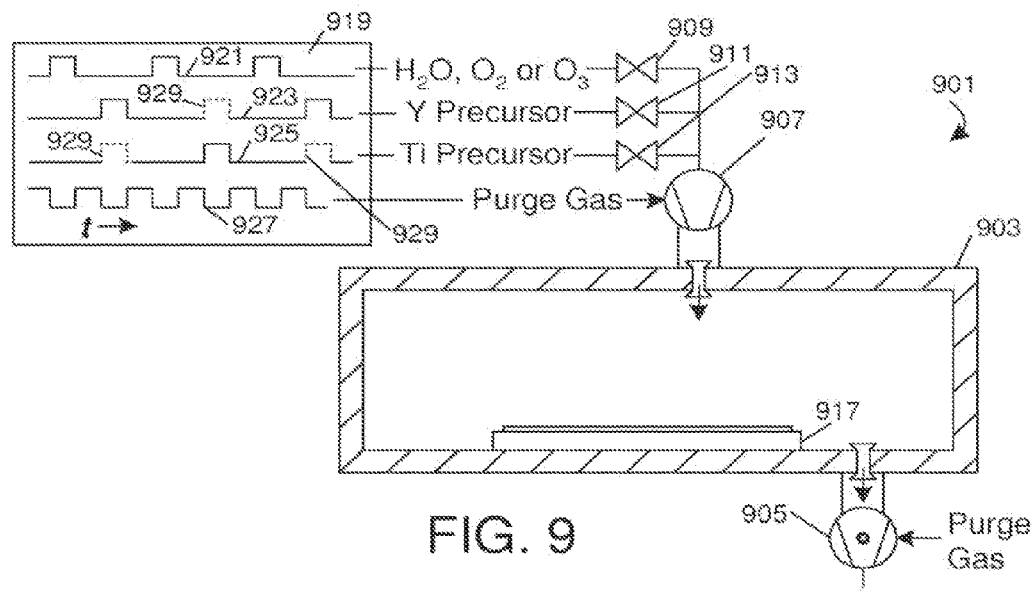
FIG. 9 is an illustrative diagram showing the layout of a vacuum chamber used in an ALD process.

FIG. 9 presents a schematic 901 of an ALD chamber and an associated timing graph 919 that may be used to create oxide monolayers of yttrium and titanium. More particularly, FIG. 9 shows a reaction chamber 903 having an evacuation pump 905 and an inlet 907, to introduce precursors and reagents into the chamber. Three valves, 909, 911 and 913 each respectively supply a reagent (e.g., vaporized water, oxygen or ozone), a yttrium precursor or a titanium precursor, as controlled by software. monolayer as it flows over the substrate, which may be mounted on a suitable holder 917 and, if desired, may be rotated or otherwise robotically manipulated during deposition or between cycles.

The timing diagram presented at the left-hand side of FIG. 9 shows relative timing pulses that may be used in one embodiment to fabricate an oxide of yttrium and titanium. In particular, a first waveform 921 represents the timing of reagent pulses, e.g., ozone (O3), oxygen gas (O2), vaporized water, or some other material, as mentioned above. Second and third waveforms, 923 and 925, respectively represent the operation of control valves 911 and 913 to supply yttrium and titanium precursors. As indicated above, these may each be organic or inorganic precursors based on the respective metal. Finally, a final waveform 927 represents a digital control over the purge gas functions, used to control both the injection and evacuation pumps (905 and 907). The process depicted in FIG. 9 may be used to introduce organometallics deposited together or sequentially without an intervening reagent and/or purge cycle. Solid lines 923 and 925 indicate the use of a sequential introduction of organometallics, for example, to deposit distinct monolayers (e.g., nanolaminate layers) of $TiO_2$ and $Y_2O_3$, alternating between these materials to thereby build up an oxide layer based on an aggregation of these layers, e.g., forty or more monolayers; alternatively, as indicated by dashed line pulses 929, injection of organometallics into the deposition chamber may in some embodiments be simultaneous, so as to deposit a number of TiV—Ox monolayers. Generally speaking, each monolayer in these embodiments can be expected to be on the order of about 112 Angstrom thick, such that forty layers would produce an oxide layer approximately two nanometers thick. Typical oxide layers can be expected to be at least this thick, with a typical range being on the order of 10-120 nanometers thickness.

FIG. 9 illustrates that, if desired, a sequence of monolayers may be deposited by introducing a titanium precursor, an oxygen source, a yttrium precursor, an oxygen source, a titanium precursor, an oxygen source, and so-on, in a repeating manner, to deposit alternating monolayers of $TiO_2$ and $Y_2O_3$, with intervening purge or other cycles as necessary.

As mentioned earlier, one problem that exists with common titanium and yttrium precursors is that they tend to react with oxygen sources at different temperatures. Generally speaking, the precursor molecules are significantly more complex than pure metal titanium and metal yttrium that might be used in a sputtering process; with poor choice of reaction temperature, the wrong molecule bonds might be broken, resulting in impurities in the resultant dielectric layer, and otherwise denigrating the fabrication process. Generally speaking, the reaction windows (or ALD process window) for common titanium precursors and common yttrium precursors, respectively, do not substantially overlap, making it difficult to fabricate devices with both titanium and yttrium using an ALD process. To this end, this disclosure provides teachings of specific combinations of precursors that may be used to address these problems.

Figure 10:
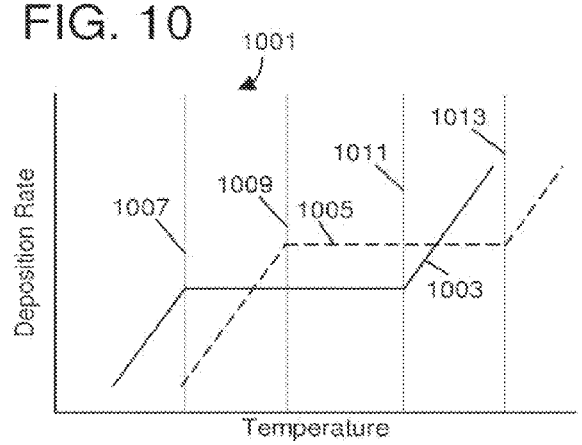
FIG. 10 is a graph 1001 that plots deposition rate as a function of temperature in an ALD process; each of two curves represents use of a different precursor (e.g., a titanium precursor 1003 and a yttrium precursor 1005). Generally speaking, common yttrium precursors react with oxygen at a significantly higher temperature than common titanium precursors, such that the "horizontal areas" normally do not align (these horizontal areas are also known as "ALD process windows," one for each precursor), which renders reactive fabrication of a combination material dielectric difficult for oxide layers having yttrium and titanium. What FIG. 10 helps demonstrate is that through selection of specific precursors, the process windows (i.e., the horizontal areas) may be caused to overlap, facilitating ALD processes for titanium and yttrium oxide at the same temperature.

FIG. 10 is a graph 1001 that plots deposition rate as a function of temperature in an ALD process; each of two curves represents use of a different precursor (e.g., a titanium precursor 1003 and a yttrium precursor 1005). Through selection of specific precursors, the process windows (i.e., the horizontal areas) may be caused to overlap, facilitating deposition processes. For each precursor, a steep low temperature slope represents the area below saturation, i.e., where deposition does not proceed satisfactorily, and a steep high temperature slope represents an area where each precursor breaks down, with chemical bond separation of the precursor molecule structure becoming unpredictable (thus significantly affecting deposited dielectric layer quality). These low slopes and high slopes for each of titanium and yttrium precursors, respectively, are identified by reference numerals 1007, 1009, 1011 and 1013. Ideally, precursors are chosen that cause these windows to overlap in view of the reagent used for the ALD process and the desired dielectric layer material.

More specifically, the following pairs of precursor materials have been found to have overlapping ALD process windows, at the approximate processing temperatures indicated below:

(a) TTIP and tris(methylcyclopentadienyl)-yttrium (Y(MeCph), at a temperature range of approximately 250-300 degrees Celsius;

(b) TDMAT and tris(methylcyclopentadienyl)-yttrium (Y(MeCp)$_3$), at a temperature range of approximately 250-300 degrees Celsius;

(c) TEMAT and tris(butylcyclopentadienyl)-yttrium ((BuCp)$_3$Y, at a temperature range of approximately 325-375 degrees Celsius; and (d) MeCp-TDMA and tris(methylcyclopentadienyl)-yttrium ((MeCp)$_3$)Y, at a temperature range of approximately 250-300 degrees Celsius.

These are not the only specific material combinations possible, but they do represent precursor combinations that should yield appropriate results and facilitate fabrication of superior dielectric layers as part of an ALD process. Generally speaking, it is believed that a precursor combination which will yield suitable results can be obtained using a titanium precursor selected from the group consisting of tetrakis isopropoxide (TTIP), tetrakis(ethylmethylamino)titanium (TEMAT), and tetrakis dimethylamino titanium (TDMAT) materials, and a yttrium precursor selected form the group of a diketonate-based yttrium material and a cyclopentadienyl(Cp)-based yttrium material, with pairing between precursors made depending upon ALD process window temperature considerations. Importantly, deposition rates associated with these materials may vary within the listed temperature ranges; therefore, in one detailed embodiment, the precise temperature within the common process window may be varied, to provide different relative deposition rates for the listed materials. Other ways of tailoring deposition rates may include controlling the volume and/or rate of precursor or reagent supply.

FIGS. 11-15 present empirical data associated with the ALD processes indicated above, and various materials implementations.

Figure 11:
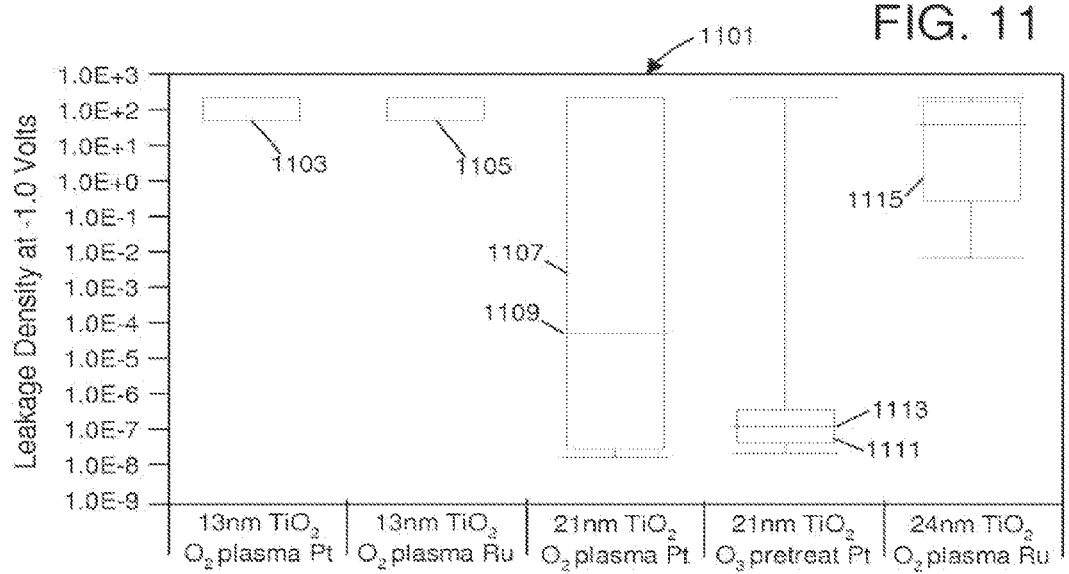
FIG. 11 is a statistical distribution diagram 1101 that plots leakage density for various ALD processes, including processes that use water as an oxygen source and a process that uses ozone gas as an oxygen source (for different electrode materials). As mentioned earlier, low leakage is desired, and thus what FIG. 11 helps demonstrate is that, of the processes represented, the process involving ozone helps provide significantly better leakage characteristics than similar processes involving oxygen gas. As will be discussed below, certain embodiments presented by this disclosure use ozone gas as a reactant with sources of titanium and/or yttrium. Tables providing the numerical data corresponding to FIG. 11 are presented below, with narrative described text.

In particular, FIG. 11 presents statistical data for leakage density for various planar metal-insulator-metal capacitors, each having either platinum or ruthenium as an electrode material, and each fabricated using an ALD process to deposit a TiO$_2$ dielectric layer. For the represented capacitors, each dielectric layer was fabricated using TTIP as the titanium source, oxygen gas to pretreat the deposition surface, and water or ozone as the titanium and oxygen reagent source. A graph 1101 shows data for five dielectric material/electrode combinations, including (a) a 13 nanometer TiO$_2$ layer, using water as the reagent and a platinum electrode (data represented by a box 1103), (b) a 13 nanometer TiO$_2$ layer, using water as the reagent and a ruthenium electrode (data represented by a box 1105), (c) a 21 nanometer TiO$_2$ layer, using water as the reagent and a platinum electrode (data represented by a box 1107), (d) a 21 nanometer TiO$_2$ layer, using ozone gas as the reagent and a platinum electrode (data represented by box 1111), and (e) a 24 nanometer TiO$_2$ layer, using water as the reagent and a ruthenium electrode (data represented by a box 1115). Each box 1103, 1105, 1107, 1111 and 1115 represents the bulk of data points associated with a standard deviation about a mean (e.g., with the mean represented by lines within certain boxes, such as indicated by numerals 1109 or 1113, respectively). Generally speaking, it is desired to produce low leakage devices in a repeatable manner, such that the more consistent the data (i.e., the "shorter" the box represented by a standard deviation about each mean) and the lower the box's height on the graph, the better the reproducibility of the leakage characteristics. As indicated by FIG. 11, data for most materials lies at the top end of the graph 1101 (representing relatively high leakage density) with the standout being the process (d), associated with the use of ozone in lieu of water as the oxidant. The results in fact show dramatically lower leakage and consistently low leakage when ozone is used as the reagent.

Incidentally, for the structures discussed herein, suitable electrode materials may include titanium nitride (TiN), platinum, iridium, iridium oxide, tungsten, tungsten oxide, molybdenum, molybdenum oxide, ruthenium and ruthenium oxide. Depending on implementation, the electrode may be a higher work function material, in order to provide a high-barrier height with respect to the dielectric. If appropriate to the implementation, the electrode may also be made to include an oxidation resistant material, which may be helpful if the fabrication process includes an anneal in an oxygen ambient. For example, in one embodiment, one or both electrodes may be made from a high work function material such as a noble or near noble metal (i.e., a metal with a low absolute value free energy change ($|\Delta G|$) of oxide formation). Noble or near noble metals include iridium, iridium oxide, platinum, ruthenium, and ruthenium oxide. The electrodes can also be multi-layer electrodes that can include one or more different materials. For example, an electrode can include a layer of ruthenium and ruthenium oxide, or a layer of iridium, iridium oxide, or platinum with another layer of binary or ternary metal nitrides which may include TiN, TiAlN, TiSiN, TaN, TaAlN, TaSiN, WN, WSiN, WCN or similar refractory metal nitrides. As mentioned, the capping layer may be chosen if desired to be an oxidation resistant material. The multi-layer electrodes can be used to improve adhesion properties and performance of memory cells in some configurations and embodiments. A designer with skills in materials engineering may, as a general matter, try different materials and select appropriate materials for the particular implementation depending on design choice and the various teachings presented by this disclosure.

Figure 12:
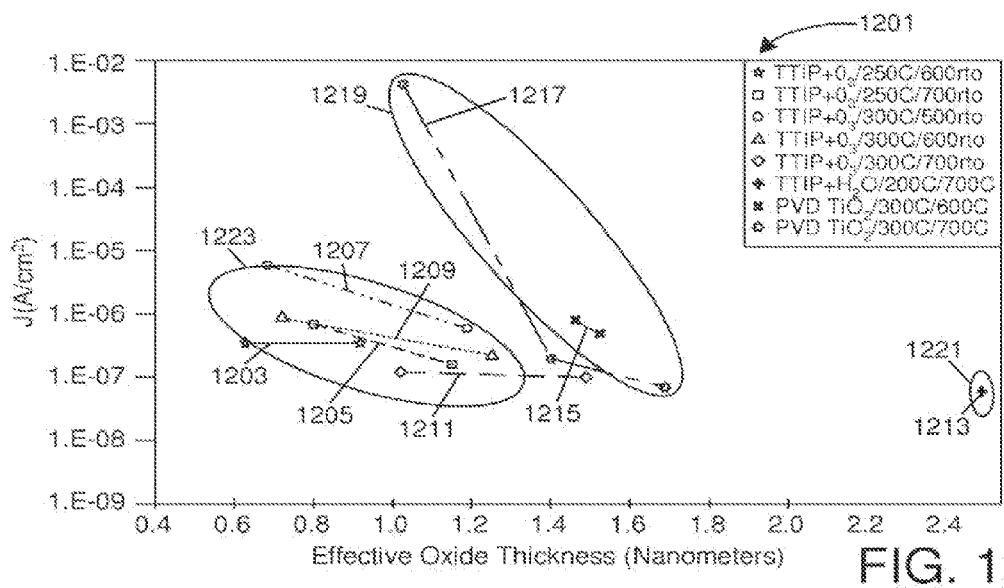
FIG. 12 is a graph 1201 that compares leakage density (J) and equivalent oxide thickness (EOT) for various ALD processes and various PVD processes, using different sources of oxygen. Three elliptical areas are charted in FIG. 12, including a first 1219 representing PVD processes, a second 1221 representing an ALD process that uses water vapor as a reactant, and a third 1223 representing ALD processes that use ozone as a reactant. It is generally desired to have low effective oxide thickness (representing effectiveness as a dielectric) while minimizing leakage density, so "better" processes and materials will generally be found at the lower-left-hand corner of FIG. 12.

FIG. 12 is a graph 1201 that shows together leakage density (J) and effective oxide thickness (EOT) for various ALD and PVD TiO$_2$ processes, using different sources of oxygen. FIG. 12 presents comparative data helpful for evaluating PVD processes and ALD processes from a general standpoint, i.e., for alternating layers of TiO$_2$/Y$_2$O$_3$. Several processes are represented by data in FIG. 12 (as indicated by a legend in the upper-right corner):

(a) a five-point star pattern and data line 1203 represent an ALD process using TTI P as a precursor, ozone gas as a reagent, an ALD process temperature of 250 degrees Celsius and a 600-degree rapid thermal oxidation (RTO) (anneal);

(b) a square box pattern and data line 1205 represent an ALD process using TTI P as a precursor, ozone gas as a reagent, an ALD process temperature of 250 degrees Celsius and a 700-degree RTO (anneal);

(c) a circle pattern and data line 1207 represent an ALD process using TTIP as a precursor, ozone gas as a reagent, an ALD process temperature of 300 degrees Celsius and a 500-degree RTO (anneal);

(d) a triangle pattern and data line 1209 represent an ALD process using TTIP as a precursor, ozone gas as a reagent, an ALD process temperature of 300 degrees Celsius and a 600-degree RTO (anneal);

(e) a diamond pattern and data line 1211 represent an ALD process using TTIP as a precursor, ozone gas as a reagent, an ALD process temperature of 300 degrees Celsius and a 700-degree RTO (anneal);

(f) a cross pattern and data line 1213 represent an ALD process using TTIP as a precursor, water vapor as a reagent, an ALD process temperature of 200 degrees Celsius and a 700-degree bake (anneal);

(g) an "x" pattern and data line 1215 represent a PVD process using a titanium dioxide target, a process temperature of 300 degrees Celsius and a 600 degree bake (anneal); and (h) a seven point start pattern and data line 1217 represent a PVD process using a titanium dioxide target, a process temperature of 300 degrees Celsius and a 700-degree bake (anneal).

Three elliptical areas are also shown in FIG. 12, including a first 1219 representing PVD processes, a second 1221 representing an ALD process that uses water vapor as a reactant, and a third 1223 representing ALD processes that use ozone as a reactant. It is generally desired to have low effective oxide thickness (representing effectiveness as a dielectric) while minimizing leakage density, so "better" processes and materials will generally be found at the lower-left-hand corner of FIG. 12; as should be apparent, of the considered processes, the ALD processes (represented by the third elliptical area 1223) provide very good results.

In FIG. 12, the vertical axis represents leakage density per square centimeter, while the horizontal axis represents effective oxide thickness expressed in nanometers; effective oxide thickness or "EOT" is a measure of dielectric thickness needed to store a specific charge, and is expressed for different materials using a normalized measure of silicon dioxide ($SiO_2$) as a reference. That is to say, the horizontal axis is a measure of effective capacitance according to the well-known formula $$C = \frac{A \cdot \varepsilon}{d}$$

where "A" represents area, "$\varepsilon$" represents dielectric constant, and "d" represents distance between capacitor plates— the smaller the thickness of dielectric needed to store a given charge, the greater the capacitance. Thus, the smaller the EOT required to store a specific charge, the more effective the material (and associated processes) at producing a dielectric (and associated components, including capacitor, DRAM cell, and so forth).

Figure 13:
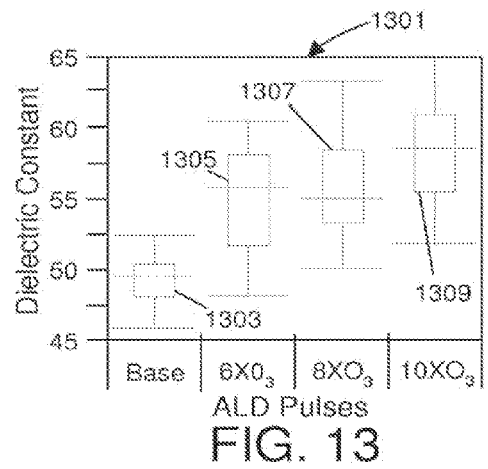
FIG. 13 is a statistical distribution diagram 1301 that plots the effectiveness of different ozone injection steps in an ALD process in terms of the dielectric constant of the resultant oxide. As generally represented by FIG. 13, a greater ozone flow rate produces generally better results, with the "base" flow rate resulting in about one liter per minute of ozone flow, and with better results achieved with a minimum of about six times this "base" flow rate.

FIG. 13 is a statistical distribution diagram 1301 that plots the effectiveness of different ozone injection steps in an ALD process in terms of the dielectric constant. As generally represented by FIG. 13, a greater ozone flow rate produces generally better results, with the "base" flow rate resulting in about one liter per minute of ozone flow, and with better results achieved with a minimum of about six times this "base" flow rate. FIG. 13 shows the effect on dielectric constant for four different ozone flow rates, including the base ("baseline") rate (injected as a twenty percent concentration of ozone in a five-second pulse against an oxygen ambient), and six, eight and ten times this effective ozone flow rate. The resultant data is shown as a series of boxes 1303, 1305, 1307 and 1309, respectively; as with FIG. 11, above, each box represents a standard deviation of data results about a mean, with the mean being represented by a horizontal line within each box—minimum and maximum data points are also each represented by a horizontal line, generally outside each box at vertical extremes. As seen in FIG. 13, the baseline ozone rate is seen to help produce a dielectric constant on the order of 49, whereas as ozone availability is increased, the resultant dielectric constant increases to the high 50s (as a median). Given the data in FIG. 13, dielectric constant appears to start leveling out for an ozone flow rate of at least six times the baseline considered (e.g., flow volumes of greater than about 6 liters per minute, injected continuously or as a series of discrete pulses).

Figure 14:
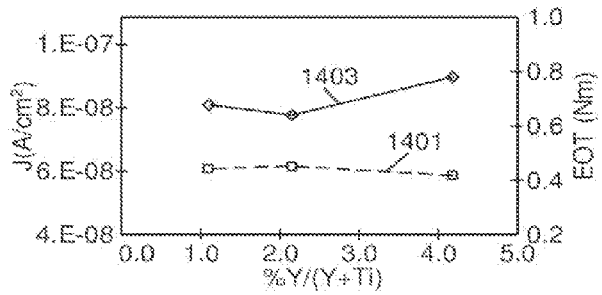
FIG. 14 is another statistical distribution diagram that plots leakage density 1401 and EOT 1403 for an ALD process where TDMAT and Y(MeCp)$_3$ used as the titanium and yttrium precursors, respectively. Notably, in the ALD process depicted in FIG. 14, yttrium contribution of between one and five percent produces acceptable results.

FIG. 14 is a graph that plots both leakage density and effective oxide thickness ("EOT") as a function of yttrium contribution to total metal. In particular, FIG. 14 plots leakage density 1401 and EOT 1403 where TDMAT and Y(MeCp)hare used as the titanium and yttrium precursors, respectively. As with the data presented above for FIG. 12, it is generally desired to have both low leakage density and low effective oxide thickness, and the data from FIG. 14 indicates that the referenced materials may be used to produce Y—Ti—Ox films having good leakage density and EOT within a range of approximately one to five percent (for ALD processes). Notably, as contrasted with sputtering processes described earlier, the ALD process discussed with respect to FIG. 14 provides excellent results for even lower concentrations of yttrium, i.e., for a range of 1-5% yttrium (as contrasted with about 16-51% yttrium for the sputtering process).

Figure 15:
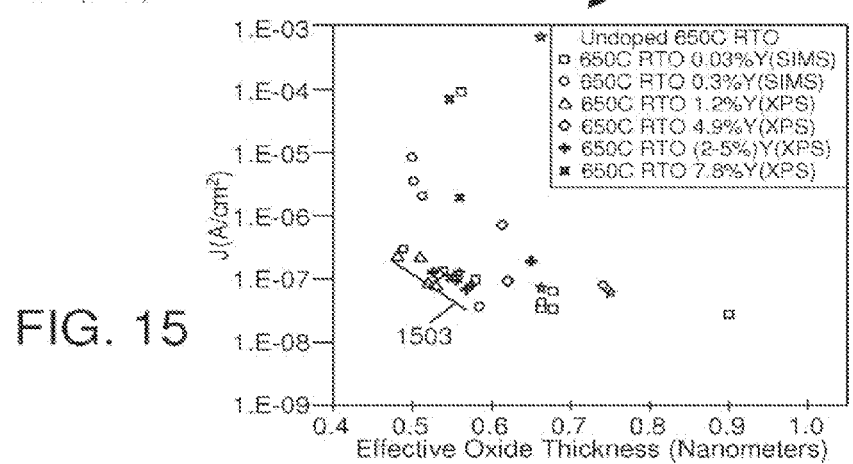
FIG. 15 is a diagram that plots leakage density and EOT for various percentages of yttrium to total metal.

FIG. 15 provides further detail, showing leakage density and EOT for various contributions of yttrium. In particular, FIG. 15 presents a graph 1501 of data for yttrium contributions of 0.00% (undoped), 0.03%, 0.3%, 1.2%, 4.9%, 2-5% and 7.8%. The yttrium proportion found to both minimize leakage density and EOT for the considered samples was approximately 1.2%. For undoped samples (represented by small stars), the leakage density and EOT were relatively high, decreasing to a near minimum for the yttrium samples of 1.2% (e.g., between one and two percent), and then increasing again as yttrium is increased above five percent (e.g., as represented by the "x" data markings in FIG. 15). The minimum seen for the presented data (i.e., as represented by the samples having 1.2% yttrium) are represented by a line denoted by numeral 1503 in FIG. 15.

The data presented in FIGS. 14 and 15 may be useful for a designer wishing to sacrifice some EOT (or dielectric constant) in favor of other process or device design considerations.

The data presented above supports the use of an ALD process as also providing superior process results for dielectric layer fabrication, particularly for oxides of yttrium and titanium and their various combinations. As further indicated by the data, the use of ozone as a reagent in these processes provides further benefits and generally produces a superior dielectric layer, relative to other oxygen sources; the use of ozone in an ALD process is seen to produce layers having better dielectric constant, lower leakage and better EOT. It is believed these characteristics result from superior reactivity between ozone and the precursor species discussed in the ALD processes introduced above, in more accurately breaking the desired bonds within the precursor species at issue, and enabling conformal fabrication of oxide molecules to the underlying substrate (and any associated monolayers). While normally difficult to deposit yttrium and titanium together in a common reaction chamber because of inconsistent process windows, the selection of specific precursors as taught by this disclosure (including a titanium source selected from the group consisting of tetrakis isopropoxide (TTIP), tetrakis (ethylmethylamino) titanium (TEMAT), and tetrakis dimethylamino titanium (TDMAT), and a yttrium source selected from the group of a diketonate-based yttrium material and a cyclopentadienyl(Cp)-based yttrium material) facilitate the use of ALD processes and thus the fabrication of amorphous monolayers.

With ALD processes suitable for manufacturing a superior dielectric layer thus described, other processes that rely upon physical vapor deposition will also now be described.

B. Physical Vapor Deposition.

Figure 16:
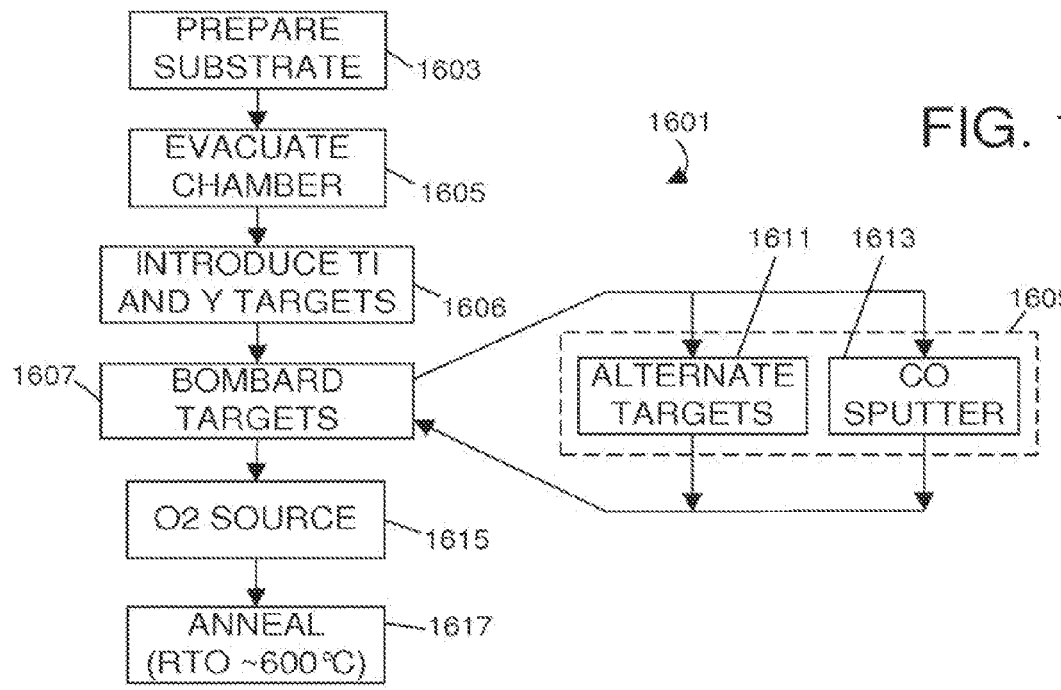
FIG. 16 is a block diagram of an embodiment that illustrates use of a reactive sputter deposition process to create a yttrium-titanium oxide (Ti—Y—Ox) layer. If desired, a co-sputtering process can be used, as indicated by reference numeral 1613 in FIG. 16.
Figure 17:
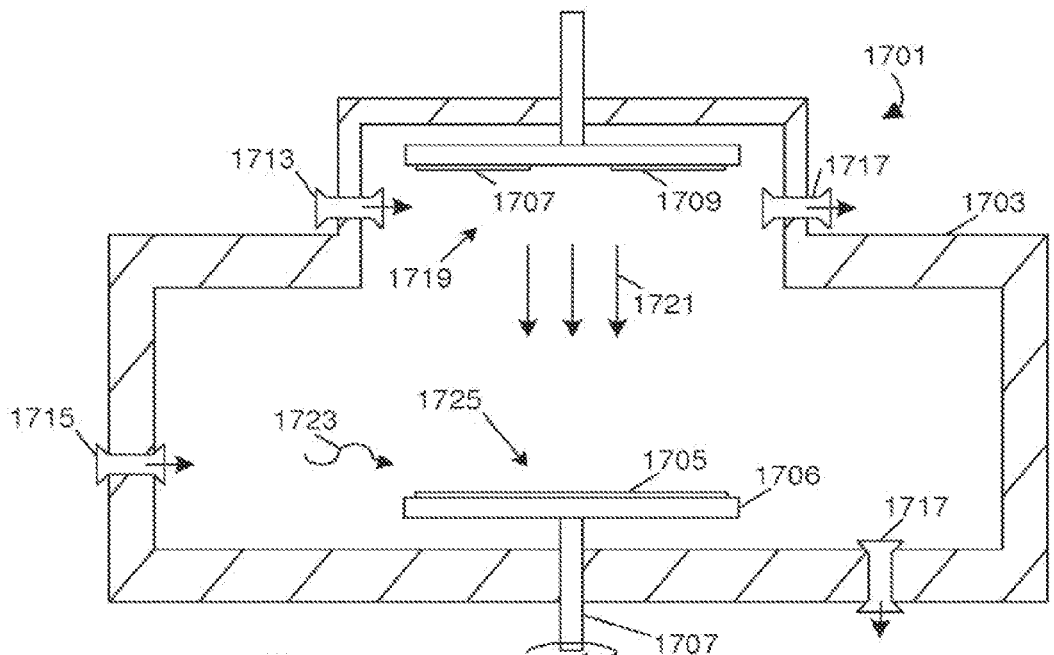
FIG. 17 is an illustrative diagram showing the layout of a vacuum chamber used in a co-sputtering process.

FIGS. 16-17 are used to present a sputter deposition process used to make an assembly of dielectric layers, such as for example, the device depicted in FIG. 2. While these physical vapor deposition ("PVD") embodiments typically will not use the specific precursor materials discussed above, but rather would rely on metal targets, it is believed that these PVD processes may benefit from some of the teachings provided above, including potentially the use of oxygen as a reactive element.

The method 1601 seen in FIG. 16 includes preparing a substrate for a deposition procedure, per reference numeral 1603. In particular, separate Ti and Y targets ($TiO_2$, Ti, Y and/or $Y_2O_3$, or another source of Ti and Y) may be introduced into a vacuum chamber for a sputtering process, as indicated by reference numerals 1605, 1606 and 1607. As with any conventional sputter deposition process, a number of different options 1609 exist for presenting targets, including mounting multiple targets on a rotating or interchangeable assembly. The sputter deposition takes place by providing a negative voltage to the sputter target so that it becomes the cathode, while making the chamber body the anode, and introducing a gas (such as Argon) into the chamber to create a plasma. By placing magnets behind the sputter target, the plasma can be confined better, allowing higher density of argon ions which can enhance the sputter rate. In lieu of an embodiment (1611) where targets are alternated, a cosputtering process may also be used (indicated by reference numeral 1613). Especially in situations where it is desired to produce a dielectric material having a dielectric constant greater than forty with minimal leakage, as has heretofore been described, cosputtering presents the opportunity to simultaneously sputter both metal Ti and metal Y onto a substrate, in an oxygen-rich reactive environment to facilitate the oxide forming process. That is to say, even within an oxide monolayer, Ti and Y can be intermixed to form a Ti—O—Ox arrangement by simultaneously transferring and reacting both metals. FIG. 16 illustrates the use of an oxygen source 1615 subsequent to the sputtering process (1607/1609), but it is also possible (as will be described below) to sputter into an oxygen environment for a simultaneous, reactive deposition of titanium and yttrium, to form a single oxide layer having both metals; such a process will be described below in connection with FIG. 17. As with the ALD process described above, a suitable dielectric thickness may be in the range of ten to twenty nanometers, and a postdeposition anneal process may thereafter be used to reduce oxygen vacancies and defects while maintaining an amorphous constituency, as indicated by function block 1617 in FIG. 16. Ideally, an annealing process of five-hundred-to-six hundred degrees (Celsius) may be used, depending on desired application and on desired dielectric layer properties. As was the case for the embodiment of FIG. 8, the anneal process may be performed at any stage of device formation, even subsequent to the deposition of electrodes or other types of layers.

FIG. 17 presents a schematic depicting a physical vapor deposition ("PVD") arrangement 1701. In particular, a vacuum chamber 1703 is seen to mount a substrate 1705 upon a turntable 1706 at one end of the chamber, with two targets 1707 and 1709 mounted at an opposite end of the chamber. The substrate is optionally rotated by an input shaft 1707 that spins the substrate to ensure uniform deposition thickness. In the chamber 1703 depicted in FIG. 17, an RF or pulsed DC process may be used, such that argon gas is introduced via an inlet 1713 (generally adjacent to the targets) and is partially ionized as part of a plasma by application of an electrical and magnetic field, as is well-known. Prior to start of deposition, residual gases in the chamber may be evacuated via an outlet 1717 which is connected to a vacuum pump such as a turbopump or a cryo-pump. With the argon ionization occurring in a first region of the chamber 1719, sputtered material from each target is transferred toward the substrate, as indicated by directional arrows 1721.

As mentioned above, oxygen, or another oxygen source may be introduced via a second inlet 1715 into the sputter chamber, as indicated by arrow 1723. The oxygen reacts with titanium and yttrium to form oxides as has been previously described, with the reaction occurring in a second region 1725 either en route to the substrate or in situ following deposition of metals on the substrate. Once a dielectric layer having the desired thickness has been created (e.g., twenty nanometers), the substrate may be subjected to the above-mentioned anneal process.

What has been described above are several specific deposition processes used to create a dielectric layer having titanium or yttrium, or both, arranged as a single layer or series of monolayers. While specific materials and specific deposition processes have been described above, it should be understood that many other processes and process material combinations can be utilized to fabricate these materials. For example, there exist many deposition processes, including CVD and other processes, which may be used to create dielectric oxides that combine titanium and yttrium. Similarly, in situations where a Ti—O—Ox layer is to be fabricated, any process may be used which intermixes or dopes oxides to have an amorphous structure, so as to deter crystalline $TiO_2$ or $Y_2O_3$ crystal formation, or to dope one of these metals into an oxide formed with the other metal.

IV. FABRICATION OF A DRAM CELL AND ASSOCIATED MEMORY ARRAY

As mentioned above, two specific applications of the principles discussed herein are to the fabrication of capacitors and to the fabrication of memory cells, including dynamic random access memory ("DRAM") cells (which form the basis for volatile memory in most contemporary computer systems). DRAM memory cells effectively use a capacitor to store charge for a period of time, with the charge being electronically "read" to determine whether a logical "one" or "zero" has been stored in the associated cell. Conventionally, a cell transistor is used to access the cell, i.e., the cell transistor is turned "on" in order to store data on each associated capacitor and is otherwise turned "off" to isolate the capacitor and preserve its charge. More complex DRAM cell structures exist, but this basic DRAM structure will be introduced below, for purposes of illustrating the application of the principles of this disclosure to capacitor manufacturing and to DRAM manufacturing. Following this introduction, several specific structures will be described, with reference to FIGS. 20-22.

Figure 18:
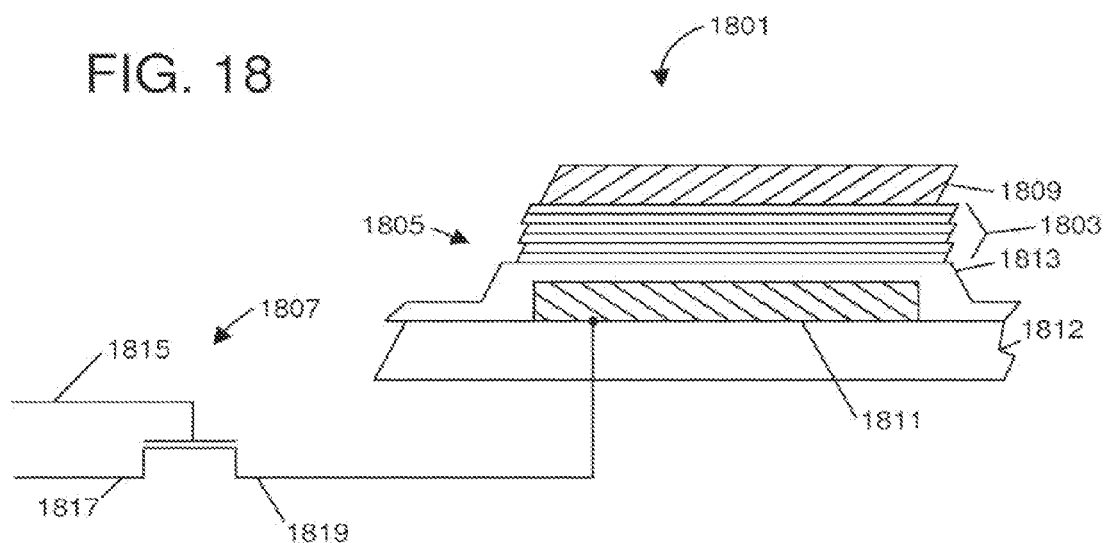
FIG. 18 is a diagram used to illustrate fabrication of a dynamic random access memory ("DRAM") cell according to the principles introduced herein.

FIG. 18 is used to illustrate one DRAM cell 1801, namely, one built using one or more monolayers that collectively form an oxide layer, e.g., as a capacitor dielectric layer 1803. The cell 1801 is depicted to schematically include two principal components, including a cell capacitor 1805 and the cell transistor 1807 (seen at the left-hand side of FIG. 18). The cell transistor is usually constituted by a MOS transistor having gate, source and drain, the gate being connected to a word line and one of the source and drain being connected to a bit line. The cell capacitor has a lower or storage electrode and an upper or plate electrode, the storage electrode being connected to the other of the source and drain of the cell transistor and the plate electrode being connected to a reference potential wiring. The cell transistor is, when selected, turned ON by an active level of the word line to read or write data from or into the cell capacitor via the bit line. The memory cell according to each of embodiments described herein includes a cell capacitor that includes an insulating layer (e.g., a dielectric) between two metal electrodes (storage and plate electrodes).

As was described above in connection with FIG. 2, the cell capacitor 1805 may include a number of layers, including two conducting layers 1809 and 1811, one of which is initially deposited or laid upon a substrate 1812, using one of many well-known processes. In the example seen in FIG. 18, the layer 1811 is used to selectively store charge to represent a logic state, i.e., it is normally electrically isolated from other components and is accessed using the cell transistor 1807. The dielectric layer 1803 helps maintain an electric field between this plate and the second conducting layer 1809, which may be connected to ground. As indicated previously, using layers made according to the process teachings explained above helps promote a higher dielectric constant with favorable leakage characteristics, and the cell 1801 depicted in FIG. 18 may therefore be made relatively smaller and be made to have a relatively thin dielectric layer. As with the case with the embodiment of FIG. 2, the layer depictions in FIG. 18 are drawn to explain principles only, and should not be understood to denote relative sizes. As is conventional, the dielectric layers formed between the conductors may include one or more other insulation layers, such as a barrier layer 1813, which may be used as a smoothing layer formed to (i) promote adhesion (depending on materials), (ii) isolate chemically, thermally or mechanically incompatible materials, or (iii) otherwise help isolate the first conducting layer 1811 of the cell capacitor. Generally speaking, this barrier layer 1813 may extend as a continuous layer to other components, for example, for use in other memory cells, or to also act as an insulator layer for the cell transistor 1807.

The cell transistor 1807 receives two inputs 1815 and 1817 from the left-hand side of FIG. 18, respectively representing column and row selection lines used to access a matrix of DRAM cells (not shown in FIG. 18). In particular, activation of a column select signal (on column selection line 1815) causes the transistor to conduct, and to electrically couple the row selection line 1817 with a drain terminal 1819 of the cell transistor, to connect the row selection line to the second conducting layer 1811 of the cell capacitor. As is known, the row line may be coupled to this conducting layer either to provide charge for storage purposes, or to "sense" the stored value of the capacitor. As is typical with DRAM devices, the cell capacitor retains charge only for a short amount of time and refresh procedures may be used if it is desired to retain charge for any significant period.

DRAM technology is relatively cheap to manufacture and usually allows a significant density to be achieved, which are primary reasons why DRAM technology is so commonly used in contemporaneous computer and other digital systems. By enabling a greater dielectric constant to be achieved, and thinner dielectric layers to be used, the principles provided by this disclosure facilitate even smaller and cheaper memory cells.

Figure 19:
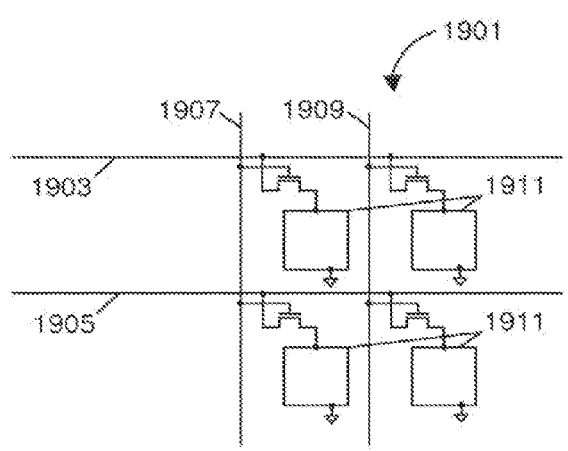
FIG. 19 shows an array of DRAM cells, each cell made using a plurality of monolayers according to the technology presented herein.

FIG. 19 illustrates a memory array 1901 formed of DRAM cells, where each cell may be (for example) identical to the cell 1801 presented in FIG. 18. While only four such cells 1911 are illustrated in FIG. 19, it should be understood that a great many cells would typically be presented on a memory device, e.g., millions. Each memory cell 1911 is accessed by a particular combination of row selection line (1903 or 1905) with column selection line (1907 and 1909); while only four address lines have been presented in FIG. 19, a great many more will typically be presented (e.g., 64 columns for memory devices that utilize a 64-bit wide parallel data bus, and a much larger number of row selection lines).

Figure 20:
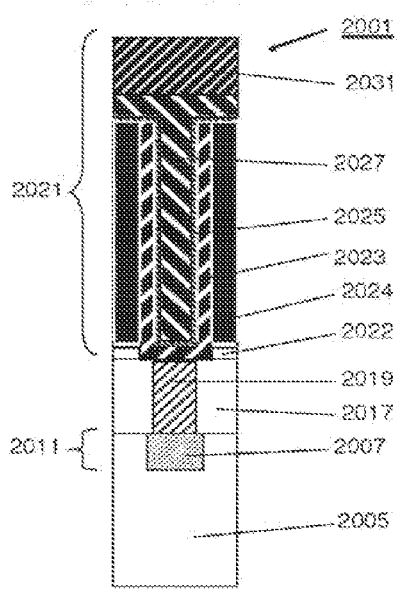
FIGS. 20-22 respectively illustrate memory cells including different capacitor configurations.
Figure 21:
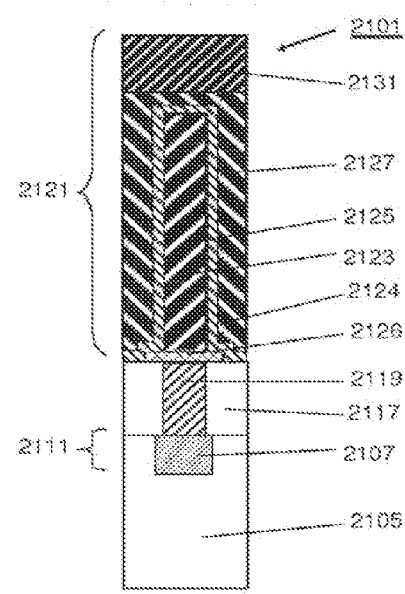
Figure 22:
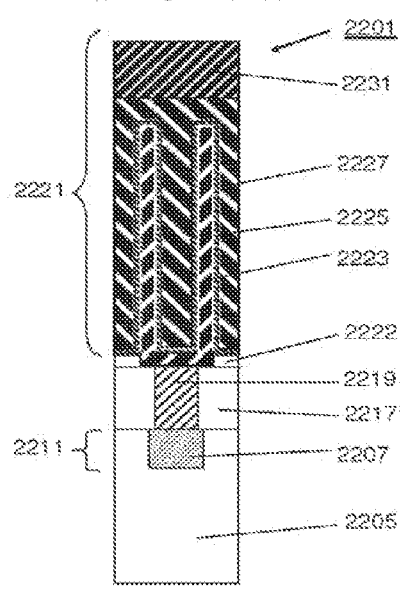

FIGS. 20-22 respectively illustrate memory cells 2001, 2101 and 2201, each illustrating different capacitor configurations. Each memory cell 2001, 2101 and 2201 is formed on a semiconductor substrate 2005, 2105 or 2205, for example, a silicon substrate. Above this substrate, a source or drain region of a cell transistor (2011, 2111 or 2211) is selectively formed. It should be noted that the gate and the other of the source and drain of the cell transistor are omitted in order to avoid the complexity of the drawings. It should be further noted that other memory cells and word and bit lines as well as memory control circuits are also not shown for the same purpose. Each cell capacitor 2021, 2121 or 2221 is formed over the substrate and is connected to the cell transistor region 2007, 2107 or 2207 through a contact plug (2019, 2119 or 2219), formed selectively in an interlayer insulating film 2017, 2117 or 2217 on the substrate. The contact plug may be made of poly-silicon and/or metal such as Tungsten, and the interlayer insulating film may be made of silicon oxide. Each capacitor 2021, 2121 or 2221 is further connected to reference potential wiring 2031, 2131 or 2231. The cell transistor of each of the memory cells is generally the same for FIGS. 20-22 and may be constituted by anyone of a planer type, a recess type, a pillar type, a fin type and any other types. However, the configuration of the storage capacitors is different for each of these FIGS.; the memory cell of FIG. 20 includes a cylinder-shaped capacitor 2021, while the memory cells of FIGS. 21-22 are respectively depicted to include a pillar-shaped capacitor 2121 and a crown-shaped capacitor 2221.

FIG. 20 illustrates a memory cell 2001 having a cylinder-shaped capacitor 2021. The capacitor 2021 has cylindrical electrodes 2023 and 2027 surrounding a dielectric layer 2025. The electrodes 2023 and 2027 and dielectric layer 2025 may be formed of the materials described herein using the processes described herein.

As an example of a general process for forming a cylinder-shaped capacitor, an etching stopper film 2022 such as silicon nitride is formed on the interlayer insulating film 2017, followed by another insulating film 2024 such as silicon oxide. The film 2024 is used to determine the height of the cell capacitor 2001. Selective etching is performed on the insulating film 2024 and the stopper film 2022 to form a cylinder hole. The upper surface of the contact plug 2019 is thereby exposed. A conductive layer is then deposited inside of the cylinder hole and on the upper surface of the contact plug 2019, followed by further selective etching, such that the lower or storage electrode 2023 is formed. The dielectric layer 2025 is formed on the storage electrode 2023 and the upper surface of the insulating film 2024. The upper or plate electrode 2027 and the wiring 2031 are thereafter formed to complete the cylinder type cell capacitor.

FIG. 21 illustrates a memory cell 2101 using a pillar- or pedestal-shaped capacitor 2121. The capacitor 2121 includes a pillar-shaped bottom electrode 2123, a dielectric layer 2125, and a top electrode 2127. The dielectric layer 2125 and top or plate electrode 2127 are deposited to conform with the pillar-shaped bottom electrode 2123. As with the capacitor 2021 from FIG. 20, the electrodes 2123 and 2127, and the dielectric layer 2125 may be formed of the materials and/or the processes described herein.

As an example of a general process for forming a pillar-shaped capacitor, a metal pad 2126 such as tungsten is selectively formed to cover the upper surface of the contact plug 2119, followed by an insulating layer (not shown) deposited over the entire surface. Thereafter, a capacitor hole for each memory cell is formed in the insulating layer by selective etching, and a conductive layer is then deposited over the insulating layer to fill each capacitor hole. The CMP (Chemical Mechanical Polishing) method is then performed on the conductive layer thus deposited, so that the pillar electrode 2123 for each memory cell is formed. After removing the insulating layer, a dielectric layer 2125 is formed on each pillar electrode 2123 and the insulating film 2117, followed by the upper electrode 2127 and the wiring 2131. The pillar type cell capacitor is thus formed.

FIG. 22 illustrates a memory cell 2101 using a crown-shaped capacitor 2221. The capacitor 2221 includes a crown-shaped bottom electrode 2223, a dielectric layer 2225, and a top electrode 2227. The dielectric layer 2225 and the top electrode 2227 conform to the crown shape of the bottom electrode 2223. As with the capacitor 2021 from FIG. 20, the electrodes 2223 and 2227 and the dielectric layer 2225 may be formed of the materials and/or the processes described herein.

The methodology for forming a crown-shaped capacitor may be similar to that depicted in FIG. 20, i.e., a lower or storage electrode for each memory cell can be first formed using etching stopper 2022 and an interlayer insulating film 2024 (see, e.g., FIG. 20). The insulating film is then, however, removed. As depicted in FIG. 22, a dielectric layer 2225 can then be deposited above the lower or storage electrode 2223, to form the crown shape. The upper or plate electrode 2227 and the wiring 2231 are then formed to complete the formation of the crown-shaped cell capacitor.

Although cylinder-, pillar-, and crown-shaped storage capacitors are described above, it is understood that these descriptions are given only as examples, and that the materials and processes described herein can be used to form any style of type of memory storage device.

V. CONCLUSION

What has been described are methods of fabricating a dielectric layer, namely, a stack of one or more layers which can be used as part of a capacitive device, memory device or similar structure. A specific novel material has been presented for use as a dielectric, enabling smaller and more efficient capacitors, memory devices and other structures to be constructed, characterized by high dielectric constant and excellent leakage characteristics. In addition, specific manufacturing processes have been presented, including the use of processes that use specific titanium and yttrium sources to create a dielectric layer and devices having improved characteristics; as an example, by using specific precursor materials, one may use an atomic layer deposition ("ALD") process to fabricate improved devices. Other applications will readily occur to those having skill in the art in view of the teachings provided above, or in view of the invention defined by the claims set forth below.

Accordingly, the foregoing discussion is intended to be illustrative only; other designs, uses, alternatives, modifications and improvements will also occur to those having skill in the art which are nonetheless within the spirit and scope of the present disclosure, which is limited and defined only by the following claims and equivalents thereto.

What is claimed is:

1. A method of forming a capacitor stack, comprising:
   depositing a first conductive layer above a substrate;
   depositing a dielectric above the conductive layer using a physical vapor deposition (PVD) process, the dielectric including both yttrium and titanium, the PVD process comprising reactive co-sputtering of a first source and a second source,
   wherein the first source comprises metallic yttrium, and
   wherein the second source comprises metallic titanium;
   controlling the relative deposition for each of titanium and yttrium so as to deposit the dielectric to have a yttrium-to-total-metal (Y/(Y+Ti)) constituency of between 16% and 41% yttrium; and
   depositing a second conductive layer above the dielectric.

2. The method of claim 1, wherein the yttrium-to-total-metal constituency is between about 20% and 40% yttrium.

3. The method of claim 2, wherein the yttrium-to-total-metal constituency is 40% yttrium.

4. The method of claim 1, wherein the dielectric has a dielectric constant of above 60.

5. The method of claim 1, wherein the dielectric has leakage characteristics approximately the same as the leakage characteristics of crystalline $Y_2O_3$.

6. The method of claim 1, further comprising using an oxygen source subsequent to the sputtering process to form a single oxide layer.

7. The method of claim 6, wherein oxygen of the oxygen source reacts with metallic yttrium sputtered from the first source and with metallic titanium sputtered from the second source to form an yttrium-titanium oxide deposited on the substrate.

8. The method of claim 1, wherein the sputtering comprises reactive sputtering in an oxygen-containing gas.

9. The method of claim 8, wherein oxygen of the oxygen source reacts with metallic yttrium sputtered from the first source and metallic titanium sputtered from the second source to form an yttrium-titanium oxide after the metallic yttrium is sputtered from the first source and the metallic titanium is sputtered from the second source and before the metallic yttrium and the metallic titanium are deposited on the substrate.

10. The method of claim 1, where at least one of depositing the first conductive layer or depositing the second conductive layer includes depositing an electrode having a material selected from the group of titanium nitride (TiN), platinum, iridium, iridium oxide, tungsten, tungsten oxide, molybdenum, molybdenum oxide, ruthenium and ruthenium oxide.

11. The method of claim 1, wherein the dielectric comprises amorphous TiYOx.

12. The method of claim 1, wherein the dielectric is less than 20 nm in thickness.

13. The method of claim 1, further comprising controlling deposition for each of titanium and yttrium so as to suppress the formation of crystalline titanium oxide and so as to suppress the formation of crystalline yttrium oxide.

14. The method of claim 1, further comprising annealing the deposited dielectric at between 500° C. and 600° C. in an atmosphere comprising oxygen.

15. The method of claim 1, wherein the reactive co-sputtering simultaneously transfers yttrium and titanium from the first source and the second source and reacts yttrium and titanium with an oxygen-containing gas.

* * * * *